United States Patent
Tanaka et al.

(10) Patent No.: US 10,608,586 B2
(45) Date of Patent: Mar. 31, 2020

(54) RESONATOR DEVICE, ELECTRONIC APPARATUS, AND VEHICLE

(71) Applicant: Seiko Epson Corporation, Tokyo (JP)

(72) Inventors: Atsushi Tanaka, Tatsuno (JP); Akio Tsutsumi, Chino (JP); Fumikazu Komatsu, Okaya (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/046,098

(22) Filed: Jul. 26, 2018

(65) Prior Publication Data
US 2019/0035848 A1    Jan. 31, 2019

(30) Foreign Application Priority Data

Jul. 27, 2017  (JP) .................................. 2017-145070

(51) Int. Cl.
| | | |
|---|---|---|
| *H03B 5/32* | (2006.01) | |
| *H03L 1/02* | (2006.01) | |
| *H03H 9/205* | (2006.01) | |
| *H03B 5/04* | (2006.01) | |
| *G04F 10/00* | (2006.01) | |
| *H01L 41/053* | (2006.01) | |
| *H03B 5/36* | (2006.01) | |
| *H03L 7/23* | (2006.01) | |
| *H03L 7/099* | (2006.01) | |
| *H03H 9/13* | (2006.01) | |
| *H03H 9/05* | (2006.01) | |

(Continued)

(52) U.S. Cl.
CPC ............. *H03B 5/32* (2013.01); *G04F 10/005* (2013.01); *H01L 41/053* (2013.01); *H03B 5/04* (2013.01); *H03B 5/362* (2013.01); *H03B 5/368* (2013.01); *H03H 9/205* (2013.01); *H03L 1/022* (2013.01); *H03L 1/028* (2013.01); *H03L 7/099* (2013.01); *H03L 7/23* (2013.01); *H03H 9/02102* (2013.01); *H03H 9/0519* (2013.01); *H03H 9/13* (2013.01); *H03H 9/17* (2013.01)

(58) Field of Classification Search
CPC ... H03L 1/02; H03L 1/028; H03L 1/04; H03L 1/022; H03L 7/099; H03B 5/32; H03B 5/04; H03B 5/02; H03H 9/205; H01L 41/053; G04F 10/005
See application file for complete search history.

(56) References Cited

U.S. PATENT DOCUMENTS

| | | | | |
|---|---|---|---|---|
| 6,946,919 B2 * | 9/2005 | Knecht | ................... | H03L 1/025 331/108 C |
| 7,471,162 B2 * | 12/2008 | Ishikawa | ................. | H03L 1/023 331/108 D |

(Continued)

FOREIGN PATENT DOCUMENTS

JP            05-087954 A      4/1993

*Primary Examiner* — Ryan Johnson
(74) *Attorney, Agent, or Firm* — Harness, Dickey & Pierce, P.L.C.

(57) ABSTRACT

A resonator device includes a first resonator that generates a reference clock signal, a second resonator that generates a first clock signal having a frequency adjusted based on the reference clock signal, and a circuit device that includes a temperature sensor for performing temperature compensation on an oscillation frequency of the first resonator. The temperature sensor is disposed on the circuit device such that the first resonator overlaps the temperature sensor in a plan view.

19 Claims, 17 Drawing Sheets

(51) Int. Cl.
*H03H 9/17* (2006.01)
*H03H 9/02* (2006.01)

(56) References Cited

U.S. PATENT DOCUMENTS

| | | | |
|---|---|---|---|
| 7,872,537 B2* | 1/2011 | Tanaka | H03H 9/1021 |
| | | | 331/158 |
| 9,634,672 B2* | 4/2017 | Yamamoto | H03L 1/02 |
| 2017/0019111 A1* | 1/2017 | Yorita | H03L 1/027 |
| 2017/0134030 A1* | 5/2017 | Mofidi | H03L 7/104 |
| 2017/0331431 A1* | 11/2017 | Kunitomo | H03H 9/02102 |

* cited by examiner

RESONATOR DEVICE, ELECTRONIC APPARATUS, AND VEHICLE

BACKGROUND

1. Technical Field

The present invention relates to a resonator device, an electronic apparatus, and a vehicle.

2. Related Art

In a resonator device that oscillates a resonator such as a piezoelectric resonator so as to generate a clock signal, an improvement in the accuracy of the oscillation frequency of the resonator is needed. As a method of improving the accuracy thereof, a method of compensating for the temperature characteristics of the oscillation frequency based on the detected temperature is known.

As an example of a resonator device, JP-A-5-087954 discloses the realization of time-digital conversion by using two crystal oscillators. In JP-A-5-087954, first and second clock signals (clock pulses) are generated by the two crystal oscillators and an edge coincidence detection circuit detects a synchronization point at which the falling edges of the first and second clock signals coincide with each other. When the synchronization point is detected, a synchronization counter starts counting in synchronization with the first and second clock signals and thus performs time measurement of calculating the unknown time from the start pulse to the stop pulse based on the result of the counting.

In JP-A-5-087954, the two crystal oscillators that generate the first and second clock signals are realized by crystal oscillators that independently oscillate. Thus, appropriate temperature compensation may not be possible. The oscillation frequencies of the two crystal oscillators affect performance of time-digital conversion (for example, time measurement accuracy and time resolution). Thus, it is desirable to appropriately temperature-compensate the oscillation frequencies of the two crystal oscillators.

SUMMARY

An advantage of some aspects of the invention is to solve at least a part of the problems described above, and the invention can be implemented as the following forms or embodiments.

An aspect of the invention relates to a resonator device including a first resonator that generates a reference clock signal, a second resonator that generates a first clock signal having a frequency adjusted based on the reference clock signal, and a circuit device that includes a substrate and a temperature sensor for performing temperature compensation on an oscillation frequency of the first resonator. The first resonator is disposed on the circuit device so as to overlap the temperature sensor in a plan view in direction perpendicular to the substrate.

According to the aspect of the invention, since the temperature sensor is disposed on the circuit device such that the first resonator overlaps the temperature sensor in plan view, the temperature sensor can appropriately detect the temperature of the first resonator. Thus, it is possible to perform temperature compensation on the oscillation frequency of the first resonator based on the temperature detected by the temperature sensor, with high accuracy. In the aspect of the invention, the frequency of the first clock signal generated by using the second resonator is adjusted based on the reference clock signal generated by using the first resonator. Since the frequency of the reference clock signal is temperature-compensated, consequently, a result similar to a case where the frequency of the first clock signal is temperature-compensated with high accuracy is obtained. In this manner, it is possible to appropriately perform temperature compensation on the oscillation frequencies of the first and second resonators. For example, it is possible to improve the performance of the circuit device.

In the aspect of the invention, the first resonator may be supported on the circuit device by a first support, and the second resonator may be supported on the circuit device by a second support.

According to this configuration, the first and second resonators have a structure of being supported on the circuit device by the first and second supports, respectively. Thus, it is possible to provide a small resonator device which is capable of compactly accommodating the first and second resonators and the circuit device while processing performance of a processing circuit is improved. In a case where the height of the first support is low, a distance between the temperature sensor and the first resonator is short and thus it is possible to measure the temperature of the first resonator with high accuracy.

In the aspect of the invention, the first support may electrically connect a terminal electrode of one electrode of the first resonator and a first terminal of the circuit device, and the second support may electrically connect a terminal electrode of one electrode of the second resonator and a second terminal of the circuit device.

According to this configuration, it is possible to electrically connect the first terminal connected to the first oscillation circuit of the circuit device to the terminal electrode of the one electrode of the first resonator by utilizing the first support for causing the first resonator to be supported by the circuit device. In addition, it is possible to electrically connect the second terminal connected to the second oscillation circuit of the circuit device to the terminal electrode of the one electrode of the second resonator by utilizing the second support for causing the second resonator to be supported by the circuit device.

In the aspect of the invention, the first support and the second support may be conductive bumps.

According to this configuration, the first resonator is supported on the circuit device by the conductive bump. It is possible to largely reduce a distance between the substrate of the first resonator and the substrate of the circuit device by using bump connection. Thus, it is possible to measure the temperature of the first resonator with high accuracy, by the temperature sensor disposed to overlap the first resonator in plan view.

In the aspect of the invention, the combined area of the first resonator and the second resonator may be smaller than the area of the circuit device in plan view.

According to this configuration, it is possible to support the first resonator and the second resonator by the circuit device such that an entirety of the first resonator and the second resonator is contained within a periphery of the circuit device in plan view. Thus, it is possible to compactly reduce the size of the resonator device in plan view, while improving the performance of the circuit device.

In the aspect of the invention, the resonator device may further include a third resonator that generates a second clock signal having a frequency adjusted based on the reference clock signal.

According to this configuration, since the frequency of the reference clock signal is temperature-compensated, consequently, a result similar to a case where the frequencies of the first and second clock signals are temperature-compensated with high accuracy is obtained. In this manner, it is possible to appropriately perform temperature compensation on the oscillation frequencies of the first to third resonators. For example, it is possible to improve performance of processing performed with the first and second clock signals by the circuit device.

In the aspect of the invention, the circuit device may include a first PLL circuit that performs phase synchronization between the reference clock signal and the first clock signal, and a second PLL circuit that performs phase synchronization between the reference clock signal and the second clock signal.

It is possible to increase the frequency of phase synchronization by performing the phase synchronization with the first and second PLL circuits in this manner, in comparison to a case where phase synchronization between the first and second clock signals is performed by one PLL circuit. Thus, it is possible to improve the performance of time-digital conversion using the first and second clock signals.

In the aspect of the invention, the circuit device may include a time-digital conversion circuit that converts a time to a digital value based on the first clock signal and the second clock signal.

According to this configuration, it is possible to realize time-digital conversion processing having high accuracy with the first and second clock signals. In the aspect of the invention, since the temperature characteristic variations of the first and second clock signals are reduced, it is possible to improve the accuracy of time-digital conversion processing.

In the aspect of the invention, the circuit device may include a time-digital conversion circuit that converts a time to a digital value based on the reference clock signal and the first clock signal.

According to this configuration, it is possible to realize time-digital conversion processing having high accuracy with the reference clock signal and the first clock signal. In the aspect of the invention, the reference clock signal is temperature-compensated with high accuracy, and temperature characteristic variations of the first clock signal having a frequency adjusted based on the reference clock signal are reduced. Thus, it is possible to improve the accuracy of the time-digital conversion processing.

In the aspect of the invention, the circuit device may include a first oscillation circuit that generates the reference clock signal by using the first resonator, and a second oscillation circuit that generates the first clock signal by using the second resonator. The circuit device may be disposed such that the first resonator overlaps the temperature sensor and the first resonator overlaps the first oscillation circuit in plan view. The circuit device may be disposed such that the second resonator overlaps the second oscillation circuit in plan view.

According to this configuration, it is possible to connect the first oscillation circuit and the first resonator with a short connection path. In addition, it is possible to connect the second oscillation circuit and the second resonator with a short connection path. Thus, it is possible to reduce extra parasitic resistance or parasitic capacitance in the connection path. Accordingly, it is possible to prevent degradation of performance occurring due to the parasitic resistance or the parasitic capacitance and to realize a high-accurate oscillator and the like.

In the aspect of the invention, the circuit device may include a first signal line through which the first clock signal is supplied to the time-digital conversion circuit and a second signal line through which the second clock signal is supplied to the time-digital conversion circuit. A first shield line may be disposed between the first signal line and the second signal line.

According to this configuration, it is possible to reduce a negative influence applied to one clock signal of the first and second clock signals by clock noise and the like of the other clock signal, by the first shield line. Thus, it is possible to improve the performance of time-digital conversion using the first and second clock signals.

In the aspect of the invention, the circuit device may include a second shield line and a third shield line. The first signal line may be disposed between the second shield line and the first shield line. The second signal line may be disposed between the third shield line and the first shield line.

According to this configuration, it is possible to reduce a negative influence applied on the first clock signal by noise other than the clock noise, by the second shield line and to reduce a negative influence applied on the second clock signal by noise other than the clock noise, by the third shield line. Thus, the performance of time-digital conversion is improved.

Another aspect of the invention relates to an electronic apparatus includes the above-described resonator device.

Still another aspect of the invention relates to a vehicle includes the above-described resonator device.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

Hereinafter, a preferred embodiment of the invention will be described in detail. The embodiment which will be described below does not unduly limit the scope of the invention described in the appended claims, and all of the configurations described in the embodiment are not indispensable means of the invention for solving the problem.

1. Resonator Device

Figure 1:
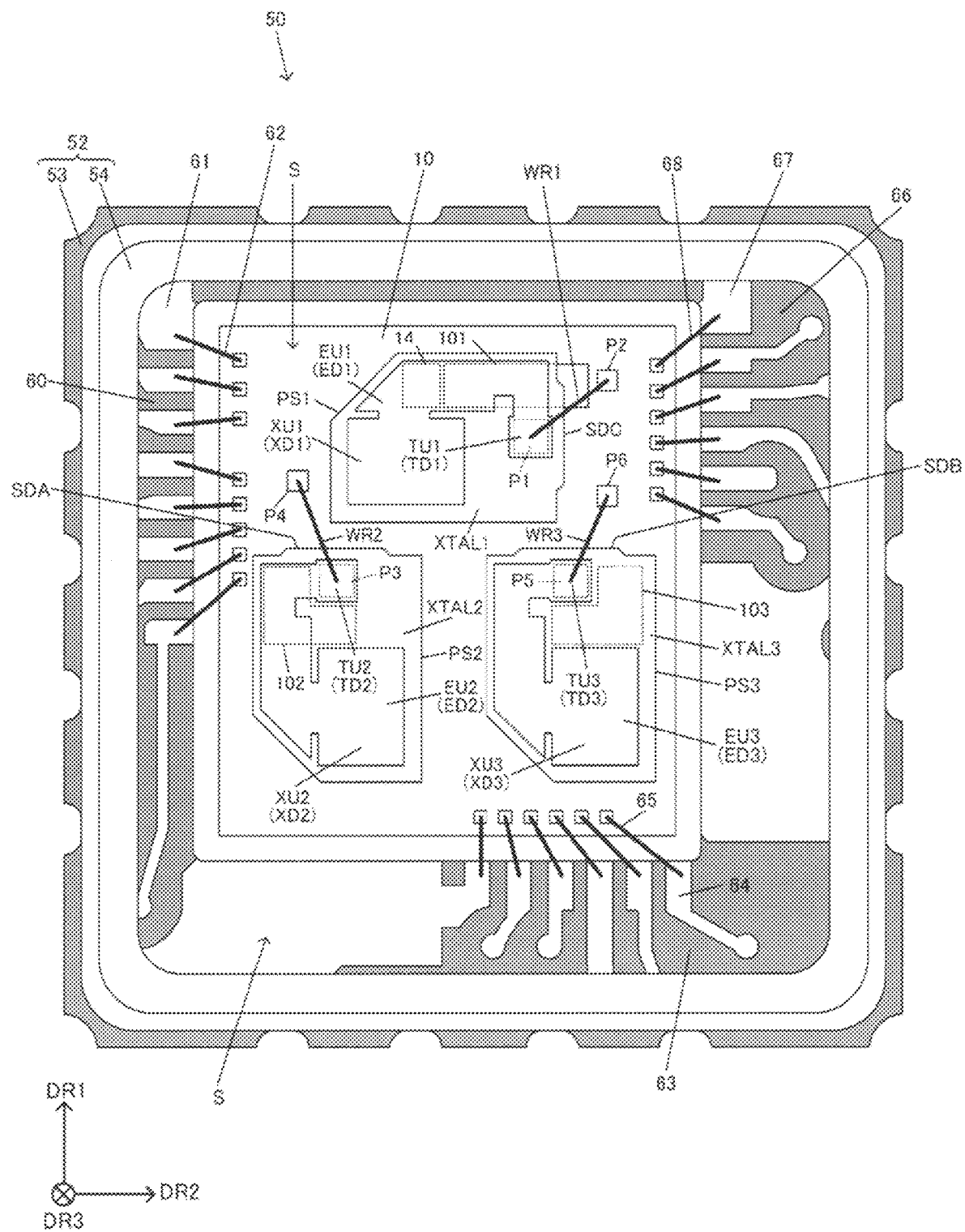
FIG. 1 is a plan view illustrating a configuration example of a resonator device according to an embodiment.
Figure 2:
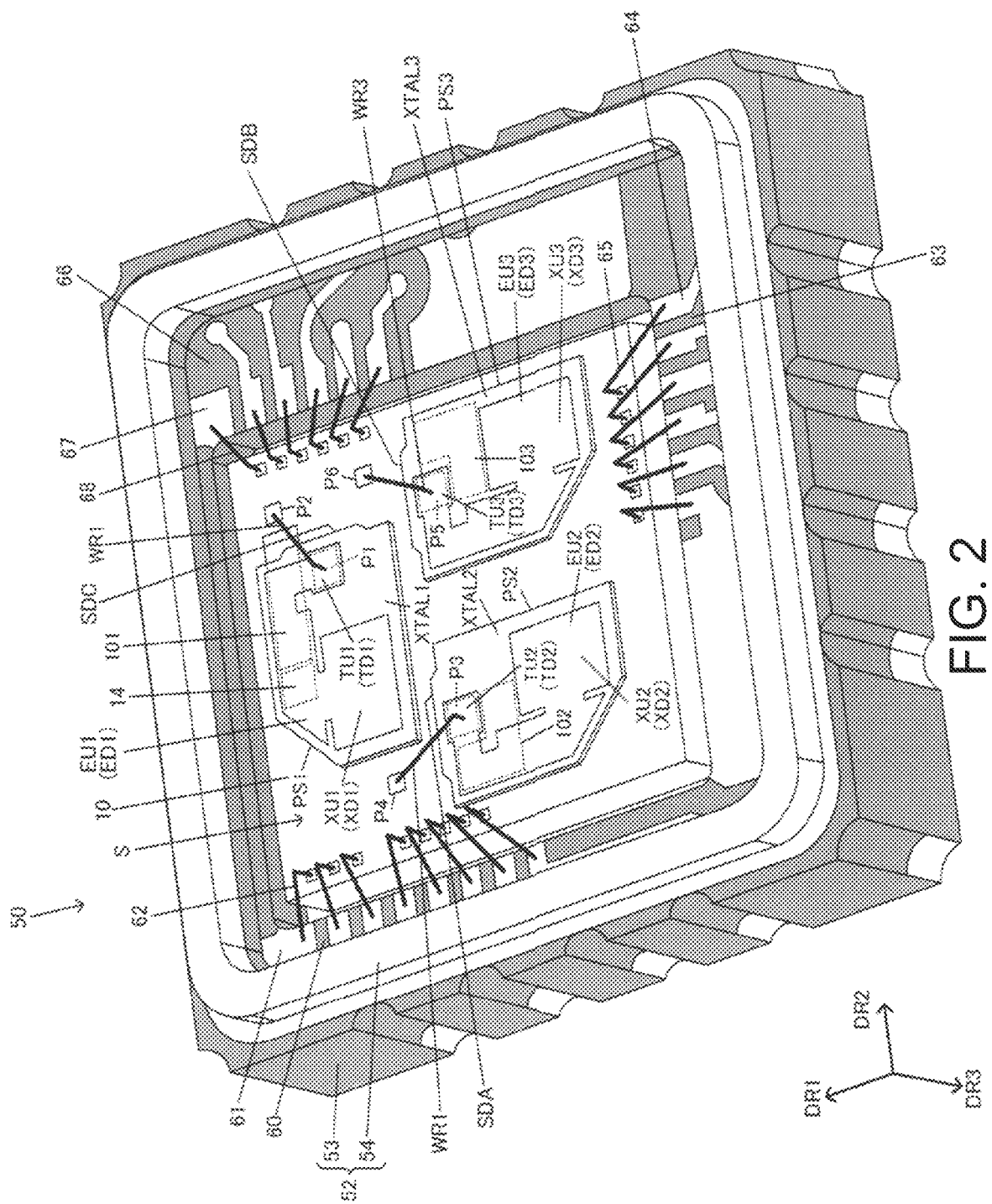
FIG. 2 is a perspective view illustrating the configuration example of the resonator device in the embodiment.

FIGS. 1 and 2 illustrate a configuration example of a resonator device 50 in the embodiment. FIG. 1 is a plan view when the resonator device 50 is viewed from the top. FIG. 2 is a perspective view when the resonator device is obliquely viewed from the top. The resonator device 50 includes resonators XTAL1 and XTAL2 (first and second resonators) and a circuit device 10. The resonator device may further include a resonator XTAL3 (third resonator). FIGS. 1 and 2 illustrate the configuration example in which three resonators are provided in the resonator device 50. However, the embodiment is not limited thereto. The number of resonators may be 2 or may be 4 or greater.

In the embodiment, a direction from the circuit device 10 to the resonators XTAL1 to XTAL3 is defined as an upward direction and the opposite direction is defined as a downward direction. For example, a lid side of a package 52 of the resonator device 50 corresponds to the upward direction and a bottom side corresponds to the downward direction. In FIGS. 1 and 2, a direction DR3 (third direction) corresponds to the downward direction and to a direction perpendicular (intersecting with) a substrate (semiconductor substrate) of the circuit device (semiconductor chip) 10 provided in the resonator device 50. The directions DR1 and DR2 (first and second directions) are perpendicular to the direction DR3. The directions DR1 and DR2 are perpendicular to each other. The direction DR1 corresponds to a direction along a first side of the package 52 of the resonator device 50. The direction DR2 corresponds to a direction along a second side of the package 52, which is perpendicular to the first side.

The resonator device 50 includes the package 52. The package 52 has a box-like base 53 and a frame (surrounding portion) 54. A lid (not illustrated) is bonded to the upper surface of the frame 54. A recess is provided in the base 53 of the package 52. The resonators XTAL1 to XTAL3 and the circuit device 10 are accommodated in an accommodation space S formed by the recess, and air-tightly sealed by the lid.

Steps 60, 63, and 66 are provided at the inner circumferential portion of the frame 54 of the package 52. The recess of the base 53 has a two-stage structure (loft structure) of an inner bottom surface and the steps 60, 63, and 66. The circuit device 10 is mounted on the inner bottom surface thereof. The circuit device 10 is, for example, an integrated circuit device (semiconductor chip). A plurality of electrodes such as electrodes 61, 64, and 67 are formed at each of the steps 60, 63, and 66. The electrodes 61, 64, and 67 are electrically connected to the corresponding terminals (pads) of the circuit device 10 via bonding wires 62, 65, and 68. The electrodes 61, 64, and 67 are electrically connected to external connection terminals provided on an outer bottom surface (outside bottom surface) of the package 52, via an internal wire and the like of the package 52. Thus, the terminal of the circuit device 10 is electrically connected to the external connection terminal.

The resonators XTAL1, XTAL2, and XTAL3 are realized, for example, by resonator elements (piezoelectric resonator elements) such as quartz crystal resonator elements. For example, the resonators are realized by quartz crystal resonator elements and the like which have a cut angle of an AT cut, an SC cut, or the like and performs thickness shear mode resonance. The resonators XTAL1, XTAL2, and XTAL3 in the embodiment are not limited thereto. For example, the resonators can be realized by various resonator elements such as resonator elements (other than a thickness shear mode type) or piezoelectric resonator elements formed of a material other than quartz crystal.

The resonator XTAL1 includes a substrate PS1 (piezoelectric substrate), a lower electrode ED1 (one electrode in a broad sense, and illustrated in FIG. 3), and an upper electrode EU1 (the other electrode in a broad sense). The substrate PS1 is a flat substrate formed of a piezoelectric material such as quartz. The upper electrode EU1 (front electrode) is formed on the upper surface (first major surface) of the substrate PS1. The lower electrode ED1 (back electrode) is formed on the lower surface (second major surface) of the substrate PS1. The upper electrode EU1 includes a rectangular (substantially rectangular) excitation electrode XU1, a rectangular (substantially rectangular) terminal electrode TU1, and a connection electrode that connects the excitation electrode XU1 and the terminal electrode TU1. The lower electrode ED1 includes an excitation electrode XD1, a terminal electrode TD1, and a connection electrode which are not illustrated. The excitation electrode XU1 of the upper electrode EU1 is provided to face the excitation electrode XD1 of the lower electrode ED1 with the substrate PS1 interposed between the excitation electrodes XU1 and XD1. The terminal electrode TU1 of the upper electrode EU1 is provided to face the terminal electrode TD1 of the lower electrode ED1 with the substrate PS1 interposed between the terminal electrodes TU1 and TD1. Thus, resonance by thickness shear is realized by applying a voltage between the excitation electrodes XU1 and XD1. In this case, a structure in which the thickness of the substrate PS1 between the excitation electrodes XU1 and XD1 (thickness thereof in the direction DR3) is thin can be employed. As described above, the resonator XTAL1 in the embodiment has a structure in which the terminal electrodes TU1 and TD1 and the connection electrode are formed on the substrate PS1 so as to be adhered to the substrate PS1 (by being stacked or by vapor deposition) in addition to the excitation electrodes XU1 and XD1.

The resonator XTAL2 includes a substrate PS2, a lower electrode ED2 (one electrode), and an upper electrode EU2 (the other electrode). The upper electrode EU2 includes an excitation electrode XU2, a terminal electrode TU2, and a connection electrode. The lower electrode ED2 includes an excitation electrode XD2, a terminal electrode TD2, and a connection electrode. The resonator XTAL3 includes a substrate PS3, a lower electrode ED3 (one electrode), and an upper electrode EU3 (the other electrode). The upper electrode EU3 includes an excitation electrode XU3, a terminal electrode TU3, and a connection electrode. The lower electrode ED3 includes an excitation electrode XD3, a terminal electrode TD3, and a connection electrode. The structures of the resonators XTAL2 and XTAL3 regarding the electrode and the like are similar to that of the resonator XTAL1, and detailed descriptions thereof will not be repeated. The lower electrodes ED1, ED2, and ED3 as the one electrode are, for example, electrodes on the third direction side (circuit device side). The upper electrodes EU1, EU2, and EU3 as the other electrode are, for example, electrodes on a fourth direction side which is a direction opposite to the third direction (DR3).

In the embodiment, the first resonator XTAL1 is a resonator that generates a reference clock signal. The second resonator XTAL2 is a resonator that generates a first clock signal having a frequency that is adjusted based on the reference clock signal. Specifically, the frequency of the first clock signal is adjusted (controlled) such that a ratio between the frequency of the reference clock signal and the frequency of the first clock signal has a given value. For example, the circuit device 10 includes a phase locked loop (PLL) circuit. The PLL circuit adjusts the oscillation frequency of the second resonator XTAL2 such that phase synchronization between the reference clock signal and the first clock signal is performed. The method of adjusting a frequency is not limited thereto. The frequency of the first clock signal may be adjusted based on the reference clock signal. For example, the frequency of the first clock signal may be controlled based on the reference clock signal, by a frequency locked loop (FLL) circuit. It is not limited to a case where the oscillation frequency of the resonator is adjusted, and the frequency of the first clock signal generated by using the resonator may be adjusted.

As illustrated in FIGS. 1 and 2, the circuit device 10 includes a temperature sensor 14 for performing temperature compensation on the oscillation frequency of the first resonator XTAL1. Specifically, the circuit device 10 includes a temperature compensation circuit and a clock signal generation circuit. The temperature compensation circuit performs temperature compensation processing based on an output of the temperature sensor 14. The clock signal generation circuit generates the reference clock signal based on the result of the temperature compensation processing. For example, in a case where the temperature compensation circuit performs temperature compensation by analog signal processing, the clock signal generation circuit may be configured by a voltage-controlled oscillator (VCO) that oscillates the second resonator XTAL2. Alternatively, in a case where the temperature compensation circuit performs temperature compensation by digital signal processing, the clock signal generation circuit may be configured by a digital controlled oscillator (DCO) that oscillates the second resonator XTAL2. Here, temperature compensation means causing the temperature sensitivity characteristics of the frequency of the reference clock signal to be reduced (for example, canceled). Specifically, temperature compensation means reducing frequency changes of the reference clock signal when the temperature detected by the temperature sensor 14 changes (for example, causing the frequency of the reference clock signal to be held more constant).

The temperature sensor 14 is disposed on the circuit device 10 such that the first resonator XTAL1 overlaps the temperature sensor 14 in a plan view in the direction DR3 perpendicular to the substrate (semiconductor substrate) of the circuit device 10 (thickness direction of the substrate). The area of the temperature sensor 14 is an area in which circuit elements (for example, transistor, resistor, capacitor, and the like) constituting the temperature sensor are disposed on the substrate. The entirety or a portion of the area of the temperature sensor 14 is overlapped by the substrate PS1 (piezoelectric substrate) of the first resonator XTAL1 in plan view. For example, among the circuit elements constituting the temperature sensor, circuit elements relating to temperature detection (circuit elements for generating a voltage having temperature characteristics) are overlapped by the first resonator XTAL1 in plan view. For example, in a case where the temperature sensor 14 is a band gap reference circuit, a bipolar transistor that outputs a base-emitter voltage having temperature characteristics is overlapped by the first resonator XTAL1 in plan view.

According to the embodiment, since the temperature sensor 14 is disposed on the circuit device 10 such that the first resonator XTAL1 overlaps the temperature sensor 14 in plan view, the temperature sensor 14 can accurately detect the temperature of the first resonator XTAL1. Thus, it is possible to perform temperature compensation on the oscillation frequency of the first resonator XTAL1 based on the temperature (temperature detection signal) detected by the temperature sensor 14, with high accuracy. In the embodiment, the frequency of the first clock signal generated by using the second resonator XTAL2 is adjusted based on the reference clock signal generated by using the first resonator XTAL1. Since the frequency of the reference clock signal is temperature-compensated, temperature induced variations of the frequency of the first clock signal are reduced. Consequently, a result similar to a case where the frequency of the first clock signal is temperature-compensated with high accuracy is obtained. It is thus possible to improve the performance of the resonator device 50 by using such a reference clock signal or first clock signal having high accuracy. For example, in time-digital conversion which will be described later, the accuracy of the frequency of the reference clock signal or the first clock signal affects performance (time measurement accuracy or resolution). However, according to the embodiment, it is possible to improve performance of time measurement.

FIGS. 1 and 2 illustrate a case where the temperature sensor 14 is disposed below the connection electrode of the first resonator XTAL1. However, the position at which the temperature sensor 14 is disposed is not limited thereto. For example, the temperature sensor 14 may be disposed on the circuit device 10 such that at least a portion (the entirety or a portion) of the temperature sensor 14 is overlapped by the excitation electrode XU1 (XD1) of the first resonator XTAL1 in plan view. According to this configuration, a portion for the excitation electrode XU1 (XD1), which is the resonating portion of the substrate PS1 of the first resonator XTAL1 may be brought closer to the temperature sensor 14. Thus, it may be possible to further improve the accuracy of temperature compensation.

In the embodiment, the resonator device 50 may include a third resonator XTAL3 that generates the second clock signal having a frequency adjusted based on the reference clock signal. The first clock signal and the second clock signal can be clock signals having frequencies that are different from each other, for example.

According to this configuration, the frequency of the first clock signal generated by using the second resonator XTAL2 and the frequency of the second clock signal generated by using the third resonator XTAL3 are adjusted based on the reference clock signal generated by using the first resonator XTAL1. Since the frequency of the reference clock signal is temperature-compensated, the temperature induced variations of the frequencies of the first and second clock signals are reduced. Consequently, a result similar to a case where the individual frequencies of the first and second clock signals are independently temperature-compensated with high accuracy is obtained. It is thus possible to improve the performance of the resonator device 50 by using such first and second clock signal having high accuracy. For example, in time-digital conversion which will be described later, a time may be measured by using the difference of the frequency between the first and second clock signals, as resolution. In this case, the difference of the frequency becomes accurate by improving the precision of the first and second clock signals and thus it is possible to improve performance of time measurement.

In the embodiment, in plan view, the combined area of the first resonator XTAL1 and the second resonator XTAL2 is smaller than the area of the circuit device 10. The area of the first resonator XTAL1 and the second resonator XTAL2 is obtained by adding the surface area of the substrate PS1 of the first resonator XTAL1 and the surface area of the substrate PS2 of the second resonator XTAL2 in plan view. The area of the circuit device 10 is the surface area of the substrate of the circuit device 10 in plan view.

According to this configuration, it is possible to support the resonators XTAL1 and XTAL2 by the substrate of the circuit device 10 such that an entirety of both resonators XTAL1 and XTAL2 overlaps the substrate of the circuit device 10 in plan view. Thus, it is possible to compactly reduce the size of the package 52 in plan view, while improving the performance of the resonator device 50. That is, it is possible to compactly accommodate the resonators XTAL1 and XTAL2 and the circuit device 10 in the package 52 in plan view. More specifically, in the plan view, the combined area of the first resonator XTAL1, the second resonator XTAL2, and the third resonator XTAL3 is smaller than the area of the circuit device 10. According to this configuration, in a case where the resonator device 50 includes three resonators, it is possible to compactly accommodate the resonators XTAL1 to XTAL3 and the circuit device 10 in the package 52 in plan view.

In the embodiment, the circuit device 10 includes a first oscillation circuit 101 that generates the reference clock signal by using the first resonator XTAL1 and a second oscillation circuit 102 that generates the first clock signal by using the second resonator XTAL2. Arrangement is performed in a manner that the first resonator XTAL1 overlaps the temperature sensor 14 and the first oscillation circuit 101 in plan view in the direction (DR3) perpendicular to the substrate of the circuit device 10. In plan view, arrangement is performed in a manner that the second resonator XTAL2 overlaps the second oscillation circuit 102. At least a portion of the first oscillation circuit 101 may be overlapped by the first resonator XTAL1 in plan view. At least a portion of the second oscillation circuit 102 may be overlapped by the second resonator XTAL2 in plan view.

According to this configuration, the first oscillation circuit 101 can be disposed to be close to the terminal P1 and the second oscillation circuit 102 can be disposed to be close to the terminal P3, while the accuracy of temperature compensation for the oscillation frequency of the first resonator XTAL1 is improved. Thus, it is possible to connect the oscillation circuits 101 and 102 and the resonators XTAL1 and XTAL2 with a short connection path, and thus to reduce extra parasitic resistance or parasitic capacitance in the connection path. Accordingly, it is possible to prevent degradation of performance occurring due to the parasitic resistance or the parasitic capacitance and to realize a high-accurate oscillator and the like.

The circuit device 10 may include a third oscillation circuit 103 that generates the second clock signal by using the third resonator XTAL3. In this case, at least a portion of the third oscillation circuit 103 may be overlapped by the third resonator XTAL3 in plan view. The oscillation circuits 101 to 103 in the above case may include a buffer circuit or circuit elements such as a resistor and a capacitor, which will be described later. The oscillation circuits 101 to 103 may include a power source circuit (regulator) that supplies power to the oscillation circuits, and the like, in addition to the buffer circuit or the circuit elements. In the embodiment, the configuration in which the resonator is supported on the circuit device by the support is described. However, the resonator device according to the invention is not limited thereto. For example, a configuration in which the resonator is supported by the package 52 (for example, loft structure of the package having the loft structure) may be provided.

2. Method of Supporting Resonator

Figure 3:
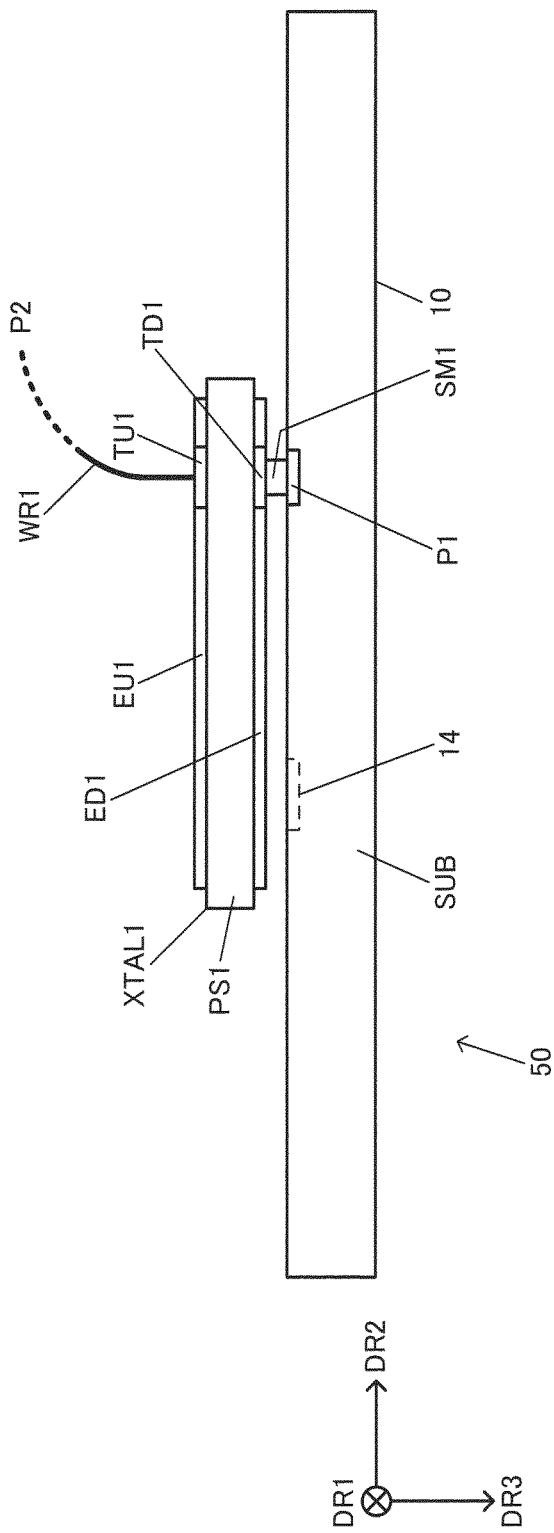
FIG. 3 is a side view diagram illustrating a configuration in which a plurality of resonators are supported on the circuit device by supports.

FIG. 3 is a diagram illustrating a configuration in which the resonator is supported on the circuit device by an upstanding support. As illustrated in FIG. 3, the first resonator XTAL1 is supported on the circuit device 10 by the first support SM1. Similarly, the second resonator XTAL2 is supported on the circuit device 10 by a second support (not illustrated).

Thus, it is possible to realize a small resonator device 50 which is capable of compactly accommodating the resonators XTAL1 and XTAL2 and the circuit device 10 in the package 52 while improving the performance of the resonator device 50. That is, in the embodiment, as illustrated in FIG. 3, the first resonator XTAL1 can be suspended just above the circuit device 10 by the first support SM1 and the second resonator XTAL2 can be suspended just above the circuit device 10 by the second support. For example, in a side view of the substrate of the circuit device 10, the substrate of the circuit device 10 and the resonators XTAL1 and XTAL2 can be disposed to be parallel to each other and be mounted to cause the major surfaces to face each other. It is possible to reduce a distance between the major surface of the substrate of the circuit device 10 and the major surface of the first resonator XTAL1 by reducing the height of the first support SM1. Thus, the distance between the temperature sensor 14 and the first resonator XTAL1 (substrate PS1) is short and thus it is possible to measure the temperature of the first resonator XTAL1 with high accuracy. In addition, it is possible to reduce a distance between the major surface of the substrate of the circuit device 10 and the major surfaces of the resonators XTAL1 and XTAL2 by reducing the height of the second support. Thus, the resonators XTAL1 and XTAL2 can be mounted by effectively using a space above the circuit device 10 and thus it is possible to realize the small resonator device 50. The resonator XTAL3 can also be mounted over the circuit device 10 by being supported by a third support.

As illustrated in FIGS. 1 and 2, the circuit device 10 includes terminals P1 and P2 connected to the first oscillation circuit 101 that oscillates the first resonator XTAL1, and terminals P3 and P4 connected to the second oscillation circuit 102 that oscillates the second resonator XTAL2. In this case, as illustrated in FIG. 3, it is desirable that the first support SM1 electrically connects the terminal P1 (first terminal) of the circuit device 10 and the terminal electrode TD1 of the lower electrode ED1 in the first resonator XTAL1. It is desirable that the second support electrically connects the terminal P3 (second terminal) of the circuit device 10 and the terminal electrode TD2 of the lower electrode ED2 in the second resonator XTAL2.

According to this configuration, the terminal P1 connected to the first oscillation circuit 101 of the circuit device 10 can be electrically connected to the terminal electrode TD1 of the lower electrode ED1 in the first resonator XTAL1, by effectively utilizing the first support SM1 for causing the first resonator XTAL1 to be supported by the circuit device 10. The terminal P3 connected to the second oscillation circuit 102 of the circuit device 10 can be electrically connected to the terminal electrode TD2 of the lower electrode ED2 in the second resonator XTAL2, by effectively utilizing the second support for causing the second resonator XTAL2 to be supported by the circuit device 10.

Figure 4:
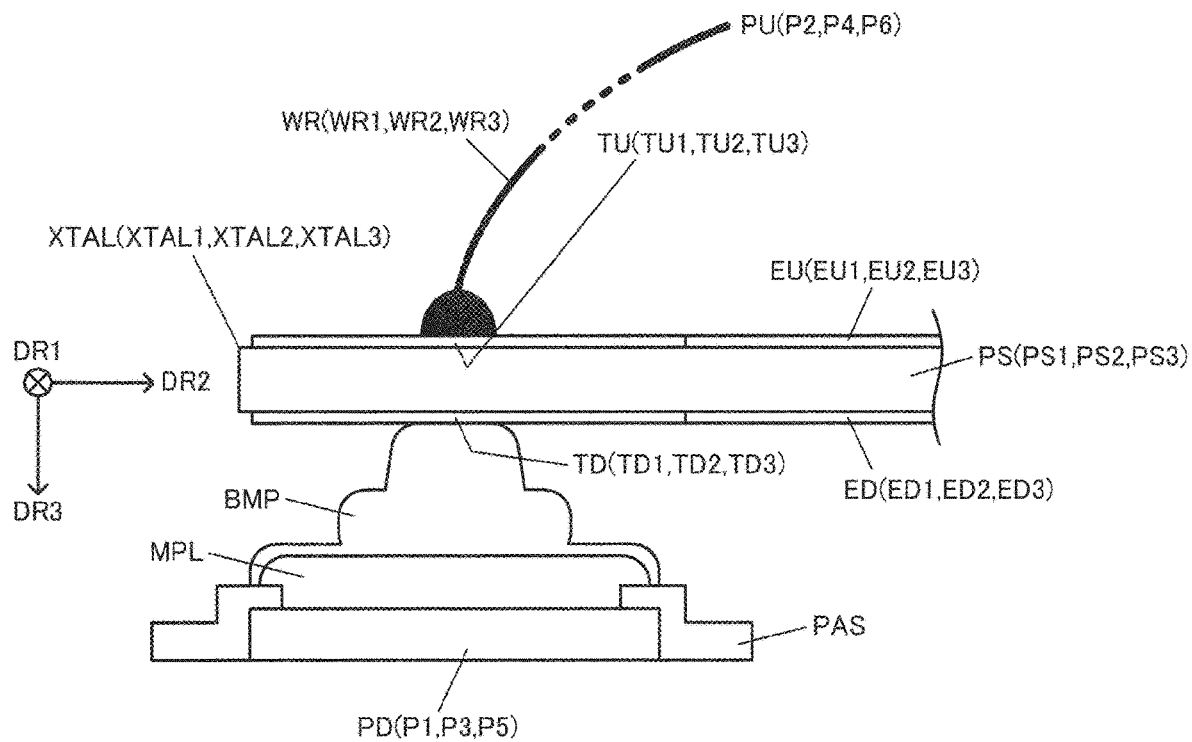
FIG. 4 is a sectional view illustrating a detailed example of bump connection.

As an example, in the resonator device 50 in the embodiment, as illustrated in FIG. 4 which will be described later, the terminal P1 of the circuit device 10 is connected to the lower electrode ED1 (TD1) of the first resonator XTAL1 with a bump (bump electrode). The terminal P3 of the circuit device 10 is connected to the lower electrode ED2 (TD2) of the second resonator XTAL2 with a bump. For example, the terminal P1 connected to the first oscillation circuit 101 is electrically connected to the lower electrode ED1 of the first resonator XTAL1 by using a conductive bump (BMP in FIG. 4) such as a metal bump. The terminal P3 connected to the second oscillation circuit 102 is electrically connected to the lower electrode ED2 of the second resonator XTAL2 by using a bump. That is, the first support SM1 and the second support are realized by using bumps for electrically connecting the terminals P1 and P3 to the lower electrodes ED1 and ED2, respectively. Here, the bump is a protruding connection electrode formed on the terminal. The bump connection is a method of connecting terminals via a bump which is a metal protrusion (conductive protrusion), with in the terminals being opposed to each other. The bump connection has an advantage, for example, that the connection length can be reduced, in comparison to wire-bonding connection.

According to this configuration, the first resonator XTAL1 is supported on the substrate of the circuit device 10 by the bump. It is possible to largely reduce a distance between the substrate PS1 of the first resonator XTAL1 and the substrate of the circuit device 10 by using bump connection. Thus, it is possible to perform temperature measurement with high accuracy, by the temperature sensor 14 disposed below the first resonator XTAL1. Here, the height of the bump is set as an HBP. The HBP is a distance between the lower surface (major surface) of the substrate of the resonator supported by the bump and the upper surface (major surface) of the substrate of the circuit device. A distance between the lower surface of the substrate of the resonator and the upper surface of the substrate of the circuit device in the loft structure is set as an HLF. The loft structure is a structure in which the circuit device 10 is disposed on the bottom portion of the package and the resonator is disposed at the loft portion of the package. For example, regarding the height of the bump, $(1/10) \times HLF \le HBP \le (1/5) \times HLF$ is satisfied. The length of one side of the pad (terminal P1 of the circuit device) connected with the bump is set as an LPD. For example, regarding the height of the bump, $(1/40) \times LPD \le HBP \le (1/5) \times LPD$ is satisfied. Desirably, $(1/20) \times LPD \le HBP \le (1/10) \times LPD$ is satisfied. As described above, by using the bump, it is possible to largely reduce the distance between the circuit device 10 and the resonators.

According to the embodiment, the lower electrode ED1 of the first resonator XTAL1 is electrically connected to the terminal P1 connected to the first oscillation circuit 101, via a conductive bump. Thus, it is possible to reduce the length of a heat conduction path from the temperature sensor 14 disposed below the first resonator XTAL1 to the first resonator XTAL1 and to measure the temperature of the first resonator XTAL1 with high accuracy. For example, in a case where the circuit device 10 is disposed at the bottom portion of the package and the resonator is disposed at the loft portion of the package, the terminal P1 connected to the first oscillation circuit 101 is connected to the terminal of the package by a bonding wire, and the terminal of the package and the terminal of the loft portion are connected to each other by a wiring in the package. By using a bump connection, the length of the heat conduction path is much shorter than that in such a connection.

The bump may be, for example, a resin core bump formed by plating a core of a bump, which is formed by resin, with metal. The first support SM1 and the second support may be realized by supports other than bumps. For example, the resonators XTAL1 and XTAL2 may be supported above the circuit device 10 by using the first support SM1 and the second support provided at places which are different from places of the terminals P1 and P3 on the circuit device 10. Alternatively, a conductive member having at least one of a shape and a material, which is different from that of a general bump may be formed at the places of the terminals P1 and P3 of the circuit device 10 and the resonators XTAL1 and XTAL2 may be supported above the circuit device 10 by using conductive members as the first support SM1 and the second support. As described above, various modifications regarding the arrangement or the configuration of the first support and the second support may be made.

FIG. 4 is a sectional view illustrating a detailed example of a bump connection. In the following descriptions, appropriately, descriptions will be made on the assumption that XTAL1 to XTAL3 are collectively described as XTAL, EU1 to EU3 are collectively described as EU, ED1 to ED3 are collectively described as ED, TU1 to TU3 are collectively described as TU, TD1 to TD3 are collectively described as TD, PS1 to PS3 are collectively described as PS, WR1 to WR3 are collectively described as WR, P1, P3, and P5 are collectively described as PD, P2, P4, and P6 are collectively described as PU, and the oscillation circuits 101 to 103 are collectively described as the oscillation circuit 100.

As illustrated in FIG. 4, the terminal PD (P1, P3, and P5) of the circuit device 10 is electrically connected to the lower electrode ED (ED1, ED2, and ED3) of the resonator XTAL (XTAL1, XTAL2, and XTAL3) via a bump BMP. Specifically, an opening (pad opening) for exposing the terminal PD is formed in a passivation film PAS of the circuit device 10. A multi-plating layer MPL made of Ni/Pd/Au and the like is formed on the terminal PD and the bump BMP (Au bump) is formed on the plating layer MPL. It is possible to improve connection strength by forming the plating layer MPL between the terminal PD and the bump BMP in this manner. The bump BMP formed on the terminal PD is connected to the terminal electrode TD (TD1, TD2, and TD3) of the lower electrode ED in the resonator XTAL. One end of the bonding wire WR (WR1, WR2, and WR3) is connected to the terminal electrode TU (TU1, TU2, and TU3) of the upper electrode EU (EU1, EU2, and EU3) above the terminal electrode TD. The other end of the bonding wire WR is connected to the terminal PU (P2, P4, and P6) of the circuit device 10. For example, as illustrated in FIGS. 1 and 2, the bonding wires WR1 and WR2 are connected to the terminals P2 and P4 of the oscillation circuits 101 and 102 of the circuit device 10, respectively. The bonding wire WR3 is connected to the terminal P6 of the oscillation circuit 103. With this configuration, the terminals P1 and P2 of the oscillation circuit 101 can be respectively connected to the upper electrode EU1 (TU1) and the lower electrode ED1 (TD1) of the resonator XTAL1 and the terminals P3 and P4 of the oscillation circuit 102 can be respectively connected to the upper electrode EU2 (TU2) and the lower electrode ED2 (TD2) of the resonator XTAL2. The terminals P5 and P6 of the oscillation circuit 103 can be connected to the upper electrode EU3 (TU3) and the lower electrode ED3 (TD3) of the resonator XTAL3, respectively.

3. Layout of Circuit Device

Figure 5:
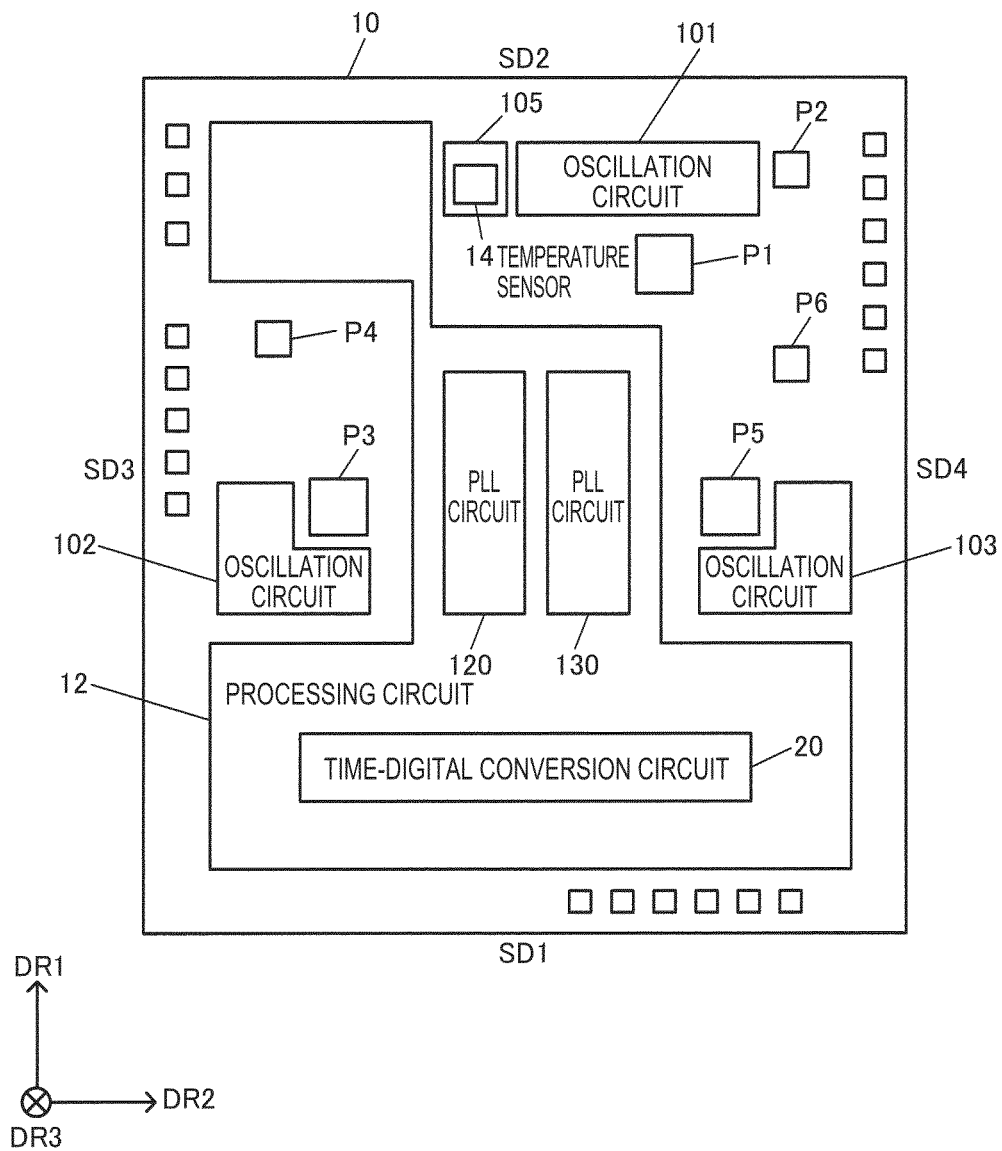
FIG. 5 illustrates a layout example of the circuit device.

FIG. 5 is a diagram illustrating a layout example of the circuit device 10. In FIG. 5, a direction from a side SD1 (first side) of the circuit device 10 toward the opposing side SD2 (second side) thereof is DR1, a direction from a side SD3 (third side) thereof intersecting with (perpendicular to) the sides SD1 and SD2 toward a side SD4 (fourth side) thereof is DR2.

The circuit device 10 includes the oscillation circuits 101, 102, and 103, a processing circuit 12, and a temperature detection circuit 105. The processing circuit 12 includes a first PLL circuit 120, a second PLL circuit 130, and a time-digital conversion circuit 20. The temperature detection circuit 105 includes the temperature sensor 14. The configuration of the circuit device including the components will be described later. The time-digital conversion circuit 20 is provided on the direction DR1 side of the side SD1. The PLL circuits 120 and 130 are provided on the direction DR1 side of the time-digital conversion circuit 20. The oscillation circuit 102 is provided between the side SD3 and the PLL circuits 120 and 130. The oscillation circuit 103 is provided between the side SD4 and the PLL circuits 120 and 130. The oscillation circuit 101 is provided on the direction DR1 side of the PLL circuits 120 and 130. The temperature detection circuit 105 is provided on the direction DR1 side of the PLL circuits 120 and 130. For example, the temperature detection circuit 105 (temperature sensor 14) is provided on the direction DR1 side of the PLL circuits 120 and 130 and on the −DR2 (opposite direction of the direction DR2) side of the oscillation circuit 101. The position of the temperature detection circuit 105 is not limited thereto. For example, the temperature detection circuit 105 may be provided on the direction DR1 side of the PLL circuits 120 and 130 and on the −DR1 (opposite direction of the direction DR1) side of the oscillation circuit 101.

The terminals P1 and P2 are provided at places for corresponding to the oscillation circuit 101 (in the vicinity of the oscillation circuit 101). The terminals P3 and P4 are provided at places for corresponding to the oscillation circuit 102. The terminals P5 and P6 are provided at places for corresponding to the oscillation circuit 103. Each of the terminals P1, P3, and P5 on which bump connection is performed has an area larger than each of the terminals P2, P4, and P6 on which wire-bonding connection is performed. The area of each of the terminals P1, P3, and P5 is about twice the area of each of the terminals P2, P4, and P6. As described above, the connection strength of the bump connection is improved, or parasitic resistance is reduced, by setting the areas of the terminals P1, P3, and P5 to be large. It is possible to realize appropriate single point support and the like of the resonator by using a portion on which bump connection is performed, as the support.

According to the resonator device 50 in the above embodiment, connection by a bonding wire is performed in at least one of a case of the terminal P2 of the circuit device 10 and the upper electrode EU1 of the resonator XTAL1 and a case of the terminal P4 of the circuit device 10 and the upper electrode EU2 of the resonator XTAL2. For example, in FIGS. 1 and 2, the terminal P2 of the circuit device 10 is connected to the upper electrode EU1 of the resonator XTAL1 by the bonding wire WR1. The terminal P4 of the circuit device 10 is connected to the upper electrode EU2 of the resonator XTAL2 by the bonding wire WR2. The terminal P6 of the circuit device 10 is connected to the upper electrode EU3 of the resonator XTAL3 by the bonding wire WR3.

As described above, in the embodiment, bump connection is performed between the terminal PD (P1, P3, and P5) of the circuit device 10 and the lower electrode ED (ED1 to ED3) of the resonator XTAL (XTAL1 to XTAL3) and wire-bonding connection is performed between the terminal PU (P2, P4, and P6) and the upper electrode EU (EU1 to EU3). According to this configuration, it is possible to realize thickness shear resonance and the like of the resonator XTAL in a manner that the oscillation circuit 100 (101 to 103) is connected between the terminals PD and PU of the circuit device 10 and a voltage is applied between the lower electrode ED and the upper electrode EU of the resonator XTAL. Since the oscillation circuit 100 and the resonator XTAL are disposed to overlap each other in plan view, it is possible to reduce the length of the bonding wire WR (WR1 to WR3) and to reduce unnecessary parasitic resistance or parasitic capacitance.

In the embodiment, as illustrated in FIGS. 1 and 2, the terminal P2 of the circuit device 10 is connected to the terminal electrode TU1 of the upper electrode EU1 in the resonator XTAL1 by the bonding wire WR1. The terminal electrode TU1 of the upper electrode EU1 and the terminal electrode TD1 of the lower electrode ED1 in the resonator XTAL1 overlap the terminal P1 of the circuit device 10 in plan view (overlap at least a portion of the terminal P1 of the circuit device 10). That is, as illustrated in FIG. 4, wire-bonding connection is performed just above the place (position of BMP) in which bump connection is performed. According to this configuration, the resonator XTAL1 can be mounted just above the circuit device 10 with being supported at a single point in the place in which bump connection is performed. For example, the resonator XTAL1 may be resonated by using the place in which bump connection is performed, as a fixed end. For example, if the resonator XTAL1 is supported at two points, thermal stress caused by, for example, a difference of a thermal expansion coefficient between the resonator XTAL1 and the circuit device 10 may be applied and thus characteristics of the resonator XTAL1 or the circuit device 10 may be affected. At this point, as illustrated in FIG. 4, if the resonator XTAL1 is mounted with being supported at a single point in the place in which bump connection is performed, it is possible to suppress an occurrence of such thermal stress and to reduce degradation of the characteristics and the like occurring due to the thermal stress.

In the embodiment, the terminal P4 of the circuit device 10 is connected to the terminal electrode TU2 of the resonator XTAL2 by the bonding wire WR2. The terminal electrodes TU2 and TD2 overlap the terminal P3 of the circuit device 10 in plan view. Similarly, the terminal P6 of the circuit device 10 is connected to the terminal electrode TU3 of the resonator XTAL3 by the bonding wire WR3. The terminal electrodes TU3 and TD3 overlap the terminal P5 of the circuit device 10 in plan view. According to this configuration, the resonators XTAL2 and XTAL3 can also be mounted just above the circuit device 10 with being supported at a single point in the place in which bump connection is performed. Thus, it is possible to reduce degradation of the characteristics and the like occurring due to thermal stress, in comparison to a case where two-point support is performed.

The descriptions of a case where one terminal PD of the circuit device 10 is connected to the lower electrode ED of the resonator XTAL with the bump and the other terminal PU is connected to the upper electrode EU by the bonding wire WR are made above. However, the embodiment is not limited thereto. For example, the terminal PD of the circuit device 10 may be connected to the lower electrode ED of the resonator XTAL with a bump and the terminal PU of the circuit device 10 may be connected to the lower electrode of the resonator XTAL (terminal obtained by extending a portion of the upper electrode EU toward the lower portion side of the substrate PS) with a bump. According to this configuration, the resonator XTAL can be mounted in two places in which the bump connection of the terminals PD and PU of the circuit device 10 is performed, with being supported at two points. Thus, it is possible to omit the step of wire-bonding connection and to prevent degradation of the performance occurring due to parasitic resistance or parasitic capacitance of the bonding wire.

In the embodiment, as illustrated in FIG. 1, the resonators XTAL2 and XTAL3 are longitudinally extended in the direction DR1 in plan view. That is, the resonators XTAL2 and XTAL3 are mounted over the circuit device 10 so as to cause the longitudinally extended direction thereof to be along the direction DR1. The resonator XTAL1 is longitudinally extended in the direction DR2 intersecting with (perpendicular to) the direction DR1 in plan view. For example, in FIG. 1, the resonators XTAL2 and XTAL3 are longitudinally disposed in a vertical direction of the page, and the resonator XTAL1 is longitudinally disposed in a horizontal direction of the page. According to this configuration, the three resonators XTAL1 to XTAL3 can be efficiently mounted on the rectangular circuit device 10. Thus, it is possible to realize a resonator device 50 in which three resonators XTAL1 to XTAL3 are efficiently accommodated in the small package 52. Since the three resonators XTAL1 to XTAL3 are provided in the resonator device 50, it is possible to realize various kinds of processing using three clock signals generated by the three resonators XTAL1 to XTAL3.

In the embodiment, as illustrated in FIGS. 1 and 2, the terminal P2 and the terminal electrode TU1 of the resonator XTAL1 are disposed with a side SDC interposed between the terminal P2 and the terminal electrode TU1 in plan view. The side SDC is the closest to the terminal P2 among the plurality of sides of the resonator XTAL1. The terminal P4 and the terminal electrode TU2 of the resonator XTAL2 are disposed with a side SDA interposed between the terminal P4 and the terminal electrode TU2 in plan view. The side SDA is the closest to the terminal P4 among the plurality of sides of the resonator XTAL2. Similarly, the terminal P6 and the terminal electrode TU3 of the resonator XTAL3 are disposed with a side SDB interposed between the terminal P6 and the terminal electrode TU3 in plan view. The side SDB is the closest to the terminal P6 among the plurality of sides of the resonator XTAL3.

As described above, if the terminal P2 and the terminal electrode TU1 are disposed with the closest side SDC interposed therebetween, the terminal P4 and the terminal electrode TU2 are disposed with the closest side SDA interposed therebetween, and the terminal P6 and the terminal electrode TU3 are disposed with the closest SDB interposed therebetween, it is possible to reduce the lengths of the bonding wires WR1, WR2, and WR3. Thus, it is possible to suppress degradation of oscillation characteristics and the like occurring due to parasitic resistance or parasitic capacitance of the bonding wires WR1, WR2, and WR3.

4. Configuration Example of Circuit Device and Resonator Device

Figure 6:
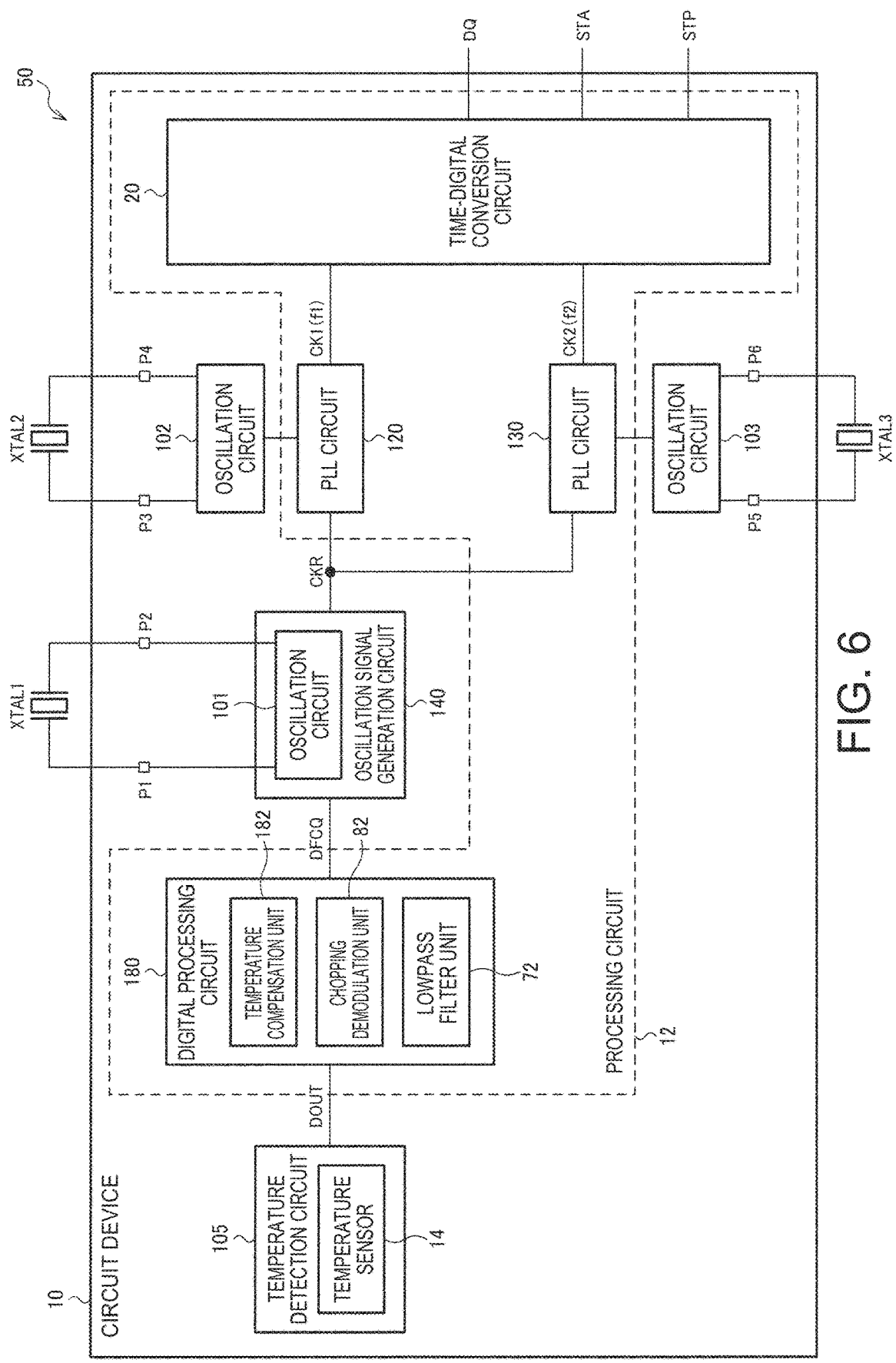
FIG. 6 illustrates a configuration example of the circuit device and the resonator device in the embodiment.

FIG. 6 illustrates the configuration example of the circuit device and the resonator device including the circuit device in the embodiment. The resonator device 50 includes the circuit device 10 and the resonators XTAL1 to XTAL3. The circuit device 10 and the resonator device 50 are not limited to the configuration in FIG. 6. Various modifications as follows may be made. For example, some components (for example, resonator XTAL3, oscillation circuit 103, PLL circuit 130, and time-digital conversion circuit 20) of the circuit device 10 and the resonator device 50 may be omitted, or other components may be added.

The circuit device 10 includes the temperature detection circuit 105, a digital processing circuit (frequency-control data generation unit, frequency-control data generation circuit) 180, an oscillation signal generation circuit 140, the oscillation circuits 102 and 103, the PLL circuits 120 and 130, and the time-digital conversion circuit 20. The digital processing circuit 180, the PLL circuits 120 and 130, and the time-digital conversion circuit 20 correspond to the processing circuit 12 in FIG. 5.

The temperature detection circuit 105 includes the temperature sensor 14. The temperature detection circuit performs A/D conversion of a temperature detection voltage and outputs A/D conversion data DOUT. As will be described later, the temperature detection circuit 105 includes a chopping modulation circuit. The A/D conversion data DOUT is modulated data. The configuration of the temperature detection circuit 105 is not limited thereto and the temperature detection circuit 105 may not perform modulation by chopping. In this case, demodulation for the chopping is not performed in the digital processing circuit 180.

The digital processing circuit 180 performs digital signal processing based on the A/D conversion data DOUT and outputs frequency control data DFCQ. Specifically, the digital processing circuit 180 includes a chopping demodulation unit 82, a lowpass filter unit 72, and a temperature compensation unit 182. The chopping demodulation unit 82 performs demodulation for chopping, on the A/D conversion data DOUT. The lowpass filter unit 72 performs lowpass filter processing on the demodulated A/D conversion data DOUT. The temperature compensation unit 182 performs temperature compensation processing of the oscillation frequency of the resonator XTAL1 based on temperature detection data which is output data of the lowpass filter unit 72.

The digital processing circuit 180 is configured by a digital signal processor (DSP), for example. The digital processing circuit 180 performs processing of the temperature compensation unit 182, the chopping demodulation unit 82, and the lowpass filter unit 72 by time division processing of the DSP. Each of the temperature compensation unit 182, the chopping demodulation unit 82, and the lowpass filter unit 72 may be configured by an individual circuit. The temperature compensation unit 182 computes frequency control data DFCQ based on temperature detection data, by using a polynomial expression for compensating for the temperature characteristics of the oscillation frequency of the resonator XTAL, for example. Coefficients of the polynomial expression are stored in a non-volatile memory (not illustrated), for example. Alternatively, the temperature compensation unit 182 acquires frequency control data DFCQ corresponding to the temperature detection data, with reference to a lookup table.

The oscillation signal generation circuit 140 generates an oscillation signal having an oscillation frequency set by the frequency control data DFCQ, and outputs a reference clock signal CKR based on the oscillation signal (for example, by shaping the waveform of the oscillation signal or dividing the oscillation signal is divided). For example, the oscillation signal generation circuit 140 generates the oscillation signal having an oscillation frequency set by the frequency control data DFCQ, by using the resonator XTAL1 and the frequency control data DFCQ from the digital processing circuit 180. Specifically, the oscillation signal generation circuit 140 includes the oscillation circuit 101 that oscillates the resonator XTAL1. The oscillation signal generation circuit 140 generates the oscillation signal by oscillating the resonator XTAL1 at the oscillation frequency set by the frequency control data DFCQ. The terminal P1 is connected to one of an output node and an input node of the oscillation circuit 101 and the terminal P2 is connected to the other node. The resonator XTAL1 is connected to the terminals P1 and P2.

For example, the oscillation signal generation circuit 140 includes a D/A conversion circuit that performs D/A conversion on the frequency control data DFCQ. The oscillation circuit 101 has variable capacitance provided at the node to which one end of the resonator XTAL1 is connected. Regarding the variable capacitance, a capacitance value is variably controlled by an output voltage of the D/A conversion circuit. The oscillation frequency of the oscillation circuit 101 (resonator XTAL1) is controlled by the capacitance value of the variable capacitance. In this case, the D/A conversion circuit may be included in the processing circuit 12 in FIG. 5. Alternatively, the oscillation signal generation circuit 140 includes a capacitor array provided at a node to which the one end of the resonator XTAL1 is connected. Regarding the capacitor array, the capacitance value is variably controlled by the frequency control data DFCQ. The oscillation frequency of the oscillation circuit 101 (resonator XTAL1) is controlled by the capacitance value of the capacitor array.

The oscillation signal generation circuit 140 may be a circuit that generates the oscillation signal in a manner of a direct digital synthesizer. For example, the oscillation signal generation circuit 140 may generate an oscillation signal having an oscillation frequency set by the frequency control data DFCQ, in a digital manner. The oscillation signal is generated, for example, by using an oscillation signal of a resonator (oscillation source of a fixed oscillation frequency), as a reference signal.

The PLL circuit 120 performs phase synchronization between a clock signal CK1 and a reference clock signal CKR. The PLL circuit 120 performs phase synchronization in a manner that feedback control is performed on the oscillation frequency of the oscillation circuit 102 (resonator XTAL2) based on a result of phase comparison between the clock signal CK1 and the reference clock signal CKR. The terminal P3 is connected to one of an output node and an input node of the oscillation circuit 102 and the terminal P4 is connected to the other node. The resonator XTAL2 is connected to the terminals P3 and P4. The PLL circuit 130 performs phase synchronization between a clock signal CK2 and the reference clock signal CKR. The PLL circuit 130 performs phase synchronization in a manner that feedback control is performed on the oscillation frequency of the oscillation circuit 103 (resonator XTAL3) based on a result of phase comparison between the clock signal CK2 and the reference clock signal CKR. The terminal P5 is connected to one of an output node and an input node of the oscillation circuit 103 and the terminal P6 is connected to the other node. The resonator XTAL3 is connected to the terminals P5 and P6.

The time-digital conversion circuit 20 converts a time difference in transition timing between a signal STA (first signal and, for example, start signal) and a signal STP (second signal and, for example, stop signal) into a digital value DQ by using the clock signals CK1 and CK2. The time difference in transition timing between the signals STA and STP is a time difference between edges of the signals STA and STP (for example, between rising edges thereof or between falling edges thereof). The frequency of the clock signal CK1 is set as f1 and the frequency of the clock signal CK2 is set as f2. The frequencies f1 and f2 are different from each other. The time-digital conversion circuit 20 converts a time into a digital value at resolution corresponding to the frequency difference ($|f1-f2|$) between the clock frequencies f1 and f2. Details of a time-digital conversion method will be described later.

According to the resonator device 50 in the above embodiment, the circuit device 10 includes the time-digital conversion circuit 20 that converts a time to a digital value DQ based on the first clock signal CK1 and the second clock signal CK2.

According to this configuration, it is possible to realize time-digital conversion processing having high accuracy with the first clock signal CK1 and the second clock signal CK2. The clock signals CK1 and CK2 are phase-synchronized with the reference clock signal CKR by the PLL circuits 120 and 130. The frequency of the reference clock signal CKR (oscillation frequency of the resonator XTAL1) is temperature-compensated. Since the resonator XTAL1 is connected to the terminal P1 with the bump, the temperature sensor 14 is positioned just below the resonator XTAL1 and the accuracy of temperature measurement is improved. Thus, it is possible to reduce the temperature characteristics of the clock signals CK1 and CK2 which have been phase-synchronized with the reference clock signal CKR and to realize time-digital conversion processing with high accuracy. That is, it is possible to reduce changes of performance (for example, changes of resolution) of time-digital conversion processing with changing the temperature.

The circuit device 10 includes the first PLL circuit 120 that performs phase synchronization between the reference clock signal CKR and the first clock signal CK1, and the second PLL circuit 130 that performs phase synchronization between the reference clock signal CKR and the second clock signal CK2.

It is possible to increase the frequency of phase synchronization by performing the phase synchronization with the first and second PLL circuits 120 and 130 in this manner, in comparison to a case where phase synchronization is performed by one PLL circuit. Thus, it is possible to improve performance of time-digital conversion using the first and second clock signals CK1 and CK2. This will be described later.

The configuration of the resonator device 50 is not limited thereto. For example, the time-digital conversion circuit 20 may convert a time to a digital value DQ based on the reference clock signal CKR and the clock signal CK1. In this case, the resonator device 50 may not include the resonator XTAL3, the oscillation circuit 103, and the PLL circuit 130. According to this configuration, it is possible to realize time-digital conversion processing having high accuracy with the reference clock signal CKR and the clock signal CK1. The clock signal CK1 is phase-synchronized with the reference clock signal CKR by the PLL circuit 120 and thus the accuracy when temperature compensation is performed on the frequency of the reference clock signal CKR is improved. Thus, it is possible to reduce changes of performance (for example, changes of resolution) of time-digital conversion processing even when the temperature changes.

In the above descriptions, a case where the resonator device 50 is a time-digital converter is described as an example. However, it is not limited thereto and the resonator device 50 may be an oscillator, for example. In this case, for example, the resonator device 50 includes the temperature detection circuit 105 (temperature sensor 14), the digital processing circuit 180, the oscillation signal generation circuit 140 (oscillation circuit 101), the oscillation circuit 102, the PLL circuit 120, and the resonators XTAL1 and XTAL2. The resonator device 50 outputs, for example, the clock signal CK1 to the outside of the device. Alternatively, the resonator device 50 outputs the reference clock signal CKR and the clock signal CK1 to the outside of the device. According to the embodiment, it is possible to realize a small resonator device 50 as illustrated in FIG. 3 and the like and to improve performance of the clock signal generated by the resonator device 50 (reduce temperature characteristics of the frequency of the clock signal).

In the above descriptions, a case where the frequencies of the clock signals CK1 and CK2 are adjusted by the PLL circuits 120 and 130 is described as an example. However, it is not limited thereto. That is, the circuit device 10 may include a control unit (control circuit) that controls the oscillation frequency of the oscillation signal of at least one of the oscillation circuits 102 and 103. Specifically, the control unit performs control of changing the oscillation frequency of the oscillation signal of at least one of the oscillation circuits 102 and 103 from a first frequency to a second frequency. For example, the control unit performs control of changing the oscillation frequency so as to cause the clock signals CK1 and CK2 to have a given frequency relationship. For example, in the related art disclosed in JP-A-5-087954, first and second crystal oscillators operate in a free run manner without any control. On the contrary, in the embodiment, the control unit controls an operation or the setting of at least one of the oscillation circuits 102 and 103. Thus, it is possible to set a frequency relationship or a phase relationship between the clock signals CK1 and CK2 to be appropriate for processing such as time-digital conversion by control of the control unit, and thus to improve the processing performance of the processing circuit 12 or simplification of the processing thereof.

5. Time-Digital Conversion

Figure 7:
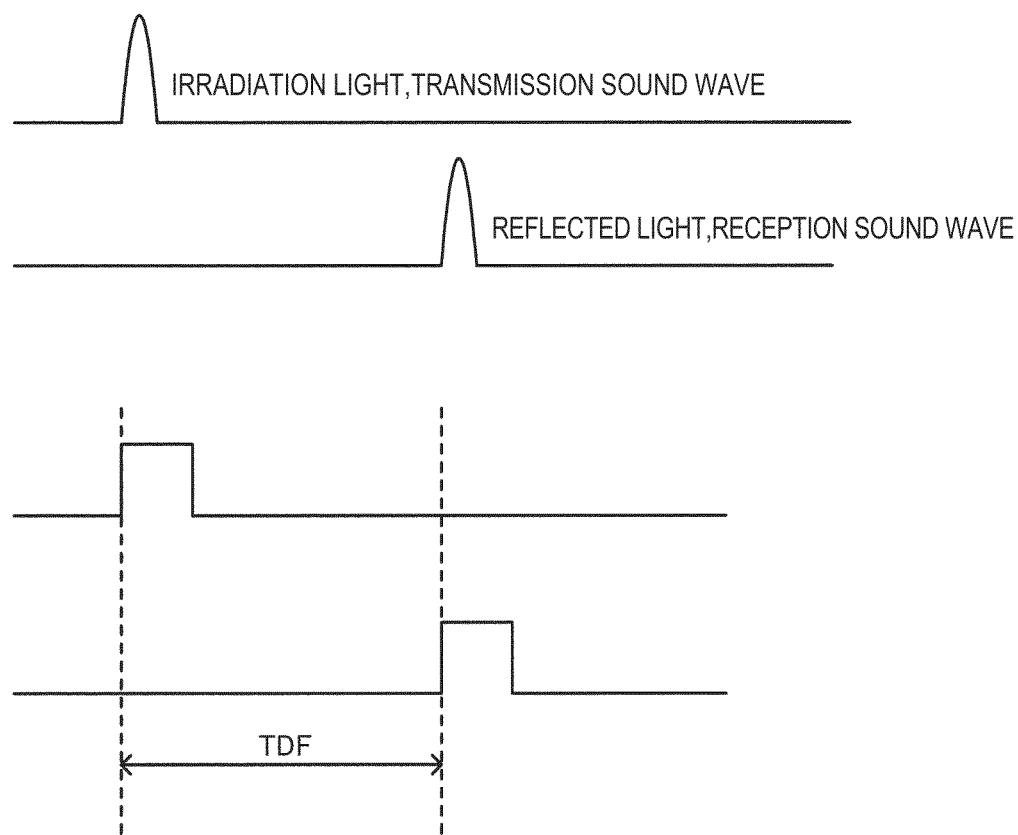
FIG. 7 is a diagram illustrating control of an oscillation frequency of an oscillation signal.

Next, a detailed example of time-digital conversion will be described. FIG. 7 is a diagram illustrating a relationship between the signal STA (start signal) and the signal STP (stop signal). The time-digital conversion circuit 20 converts a time difference TDF in transition timing between the signals STA and STP into a digital value DQ. In FIG. 7, TDF indicates a time difference between transition timings when the signals STA and STP rise (between rising edges). However, TDF may indicate a time difference between transition timings when the signals STA and STP fall (between falling edges). The resonator device in the embodiment can be used in a physical quantity measurement device in addition to the oscillator. In this case, the resonator device 50 as the physical quantity measurement device emits irradiation light (for example, laser light) to a target (for example, object around a car) by using the signal STA as illustrated in FIG. 7. The signal STP is generated by receiving reflected light from the target. For example, the signal STP is generated by shaping the waveform of a received light signal. According to this configuration, it is possible to measure a distance to the target as the physical quantity, for example, in a manner of time of flight (TOF), by converting a time difference TDF in transition timing between the signals STA and STP into a digital value DQ. Thus, it is possible to use the measured distance for automated driving of cars and motion control of robots, for example.

Alternatively, the resonator device 50 as the physical quantity measurement device transmits a transmission sound wave (for example, ultrasonic wave) to a target (for example, living body) by using the signal STA. The signal STP is generated by receiving a reception sound wave from the target. For example, the signal STP is generated by shaping the waveform of the reception sound wave. According to this configuration, it is possible to measure a distance from the target and the like and to, for example, measure biological information by the ultrasonic wave, by converting a time difference TDF into a digital value DQ.

In FIG. 7, transmission data may be transmitted by the signal STA. A time from the transmission data is transmitted until reception data is received may be measured by the signal STP generated by receiving the reception data. The physical quantity measured in the embodiment is not limited to the time and the distance. Various kinds of physical quantities such as a flow quantity, a flow rate, a frequency, a velocity, acceleration, an angular velocity, and angular acceleration are considered.

Figure 8:
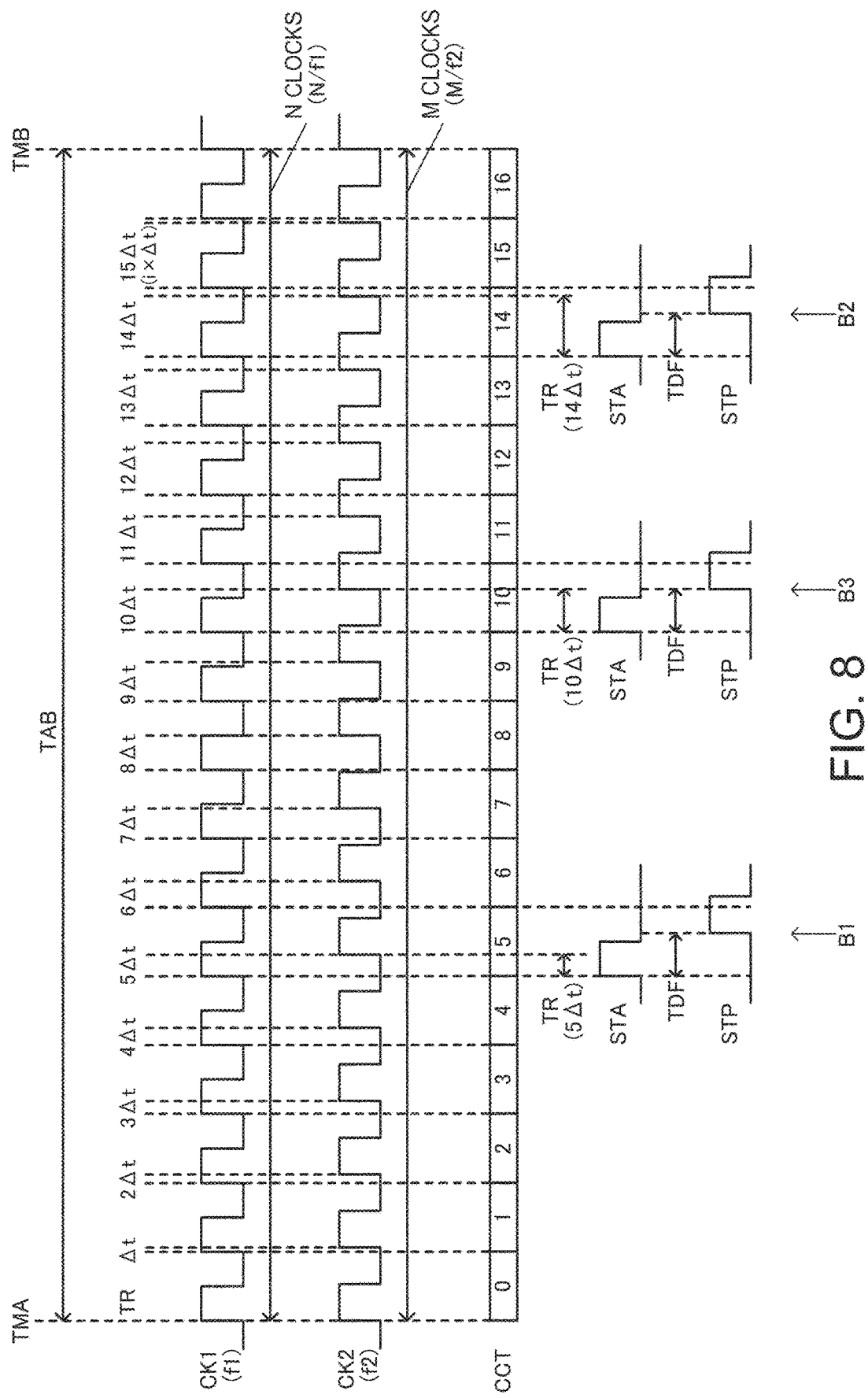
FIG. 8 is a signal waveform diagram illustrating an example of time-digital conversion.

FIG. 8 is a signal waveform diagram illustrating a time-digital conversion method in the embodiment. Phase synchronization between clock signals CK1 and CK2 is performed at a phase synchronization timing TMA and transition timings of the clock signals CK1 and CK2 coincide with each other. Then, the time difference TR (phase difference) between clocks of the clock signals CK1 and CK2 is increased for each clock cycle (CCT) by Δt so as to come to Δt, 2Δt, 3Δt, . . . . For example, phase synchronization between the clock signals CK1 and CK2 is performed at the next phase synchronization timing TMB and transition timings of the clock signals CK1 and CK2 coincide with each other.

In the embodiment, a time is converted into a digital value by using a plurality of resonators XTAL2 and XTAL3 and using the clock frequency difference therebetween. That is, the time-digital conversion circuit 20 converts a time into a digital value at resolution corresponding to the frequency difference (|f1−f2|) between the clock frequencies f1 and f2. The time-digital conversion circuit converts the time into the digital value by using the principle of a Vernier caliper, for example. According to this configuration, resolution of time-digital conversion can be set by using the frequency difference (|f1−f2|), and thus it is possible to, for example, improve performance of time-digital conversion, such as accuracy or resolution. Specifically, the resolution (time resolution) in time-digital conversion can be represented by Δt=|1/f1−1/f2|=|f1−f2|/(f1×f2). Thus, the time-digital conversion circuit 20 converts a time into a digital value at resolution Δt satisfying Δt=|1/f1−1/f2|=|f1−f2|/(f1×f2). The resolution is represented by Δt=|f1−f2|/(f1×f2) and corresponds to the frequency difference (|f1−f2|).

According to this configuration, the resolution in time-digital conversion can be set by setting the clock frequencies f1 and f2. For example, it is possible to reduce the resolution $\Delta t$ by reducing the frequency difference (|f1−f2|), and to realize time-digital conversion having high resolution. It is possible to reduce the resolution $\Delta t$ by setting the clock frequencies f1 and f2 to be high frequencies, and to realize time-digital conversion having high resolution. If the clock signals CK1 and CK2 are generated by the resonators XTAL2 and XTAL3, accuracy of time-digital conversion is also improved in comparison to a case using a delay element of a semiconductor element. In particular, in the embodiment, since quartz crystal resonators are used as the resonators XTAL2 and XTAL3, it is possible to suppress fluctuation in the clock frequencies f1 and f2 occurring by manufacturing variation or environmental fluctuation such as temperature fluctuation, to the minimum. Thus, it is possible to also suppress fluctuation of the resolution $\Delta t=|f1-f2|/(f1\times f2)$ to the minimum and to realize further improvement of the performance of time-digital conversion.

As illustrated in FIG. 8, the length of a period TAB between the phase synchronization timings TMA and TMB corresponds to N clocks of the clock signal CK1. The length of the period TAB corresponds to M clocks of the clock signal CK2. Here, N and M are integers of 2 or greater, which are different from each other. In FIG. 8, N is set to 17, M is set to 16, and N−M=1 is satisfied. A relationship of TAB=N/f1=M/f2 is established. That is, at least one of the oscillation circuits 102 and 103 is controlled to establish the relationship of N/f1=M/f2.

In the embodiment, even in a case where the clock frequency fluctuates by manufacturing variation or environmental fluctuation, at least one of the oscillation circuits 102 and 103 is controlled to cause the clock signals CK1 and CK2 to have a given frequency relationship or phase relationship. Thus, the frequency relationship or the phase relationship between the clock signals CK1 and CK2 is adjusted such that the fluctuation caused by the manufacturing variation or environmental fluctuation is compensated. Thus, even in a case where such fluctuation occurs, it is possible to realize appropriate time-digital conversion. It is possible to prevent degradation of conversion accuracy occurring by shift of the transition timings of the clock signals CK1 and CK2 at the phase synchronization timings TMA and TMB. Thus, the performance of time-digital conversion is improved.

As described above, the oscillation circuits are controlled to establish the relational expression of N/f1=M/f2. The resolution in time-digital conversion is represented by a relational expression of $\Delta t=|f1-f2|/(f1\times f2)$. Thus, Expression (1) is established. According to this configuration, the clock signals CK1 and CK2 can be generated by setting N, M, and the like are set in accordance with the resolution $\Delta t$ required for time-digital conversion.

$$\Delta t=|N-M|/(N\times f2)=|N-M|/(M\times f1) \quad (1)$$

In FIG. 8, after the phase synchronization timing TMA, a time difference TR between clocks, which is a time difference between the transition timings of the clock signals CK1 and CK2 in the first to i-th clock cycles (i is an integer of 2 or greater) is $\Delta t$ to $i\times\Delta t$. In this case, in the embodiment, a digital value DQ corresponding to the time difference TR is obtained in a manner that one of $\Delta t$ to $i\times\Delta t$ as the time difference TR between clocks regarding transition timings of the clock signals CK1 and CK2 corresponds to the time difference TDF between the transition timings of the signals STA and STP. For example, as indicated by B1 and B2 in FIG. 8, the time difference TDF between the signals STA and STP satisfies TDF>TR=5$\Delta t$ and TDF<TR=14$\Delta t$. As indicated by B3, the time difference TDF is equal to (substantially the same as) TR=10$\Delta t$. Thus, the time difference TDF is specified to correspond to TR=10$\Delta t$.

Figure 9:
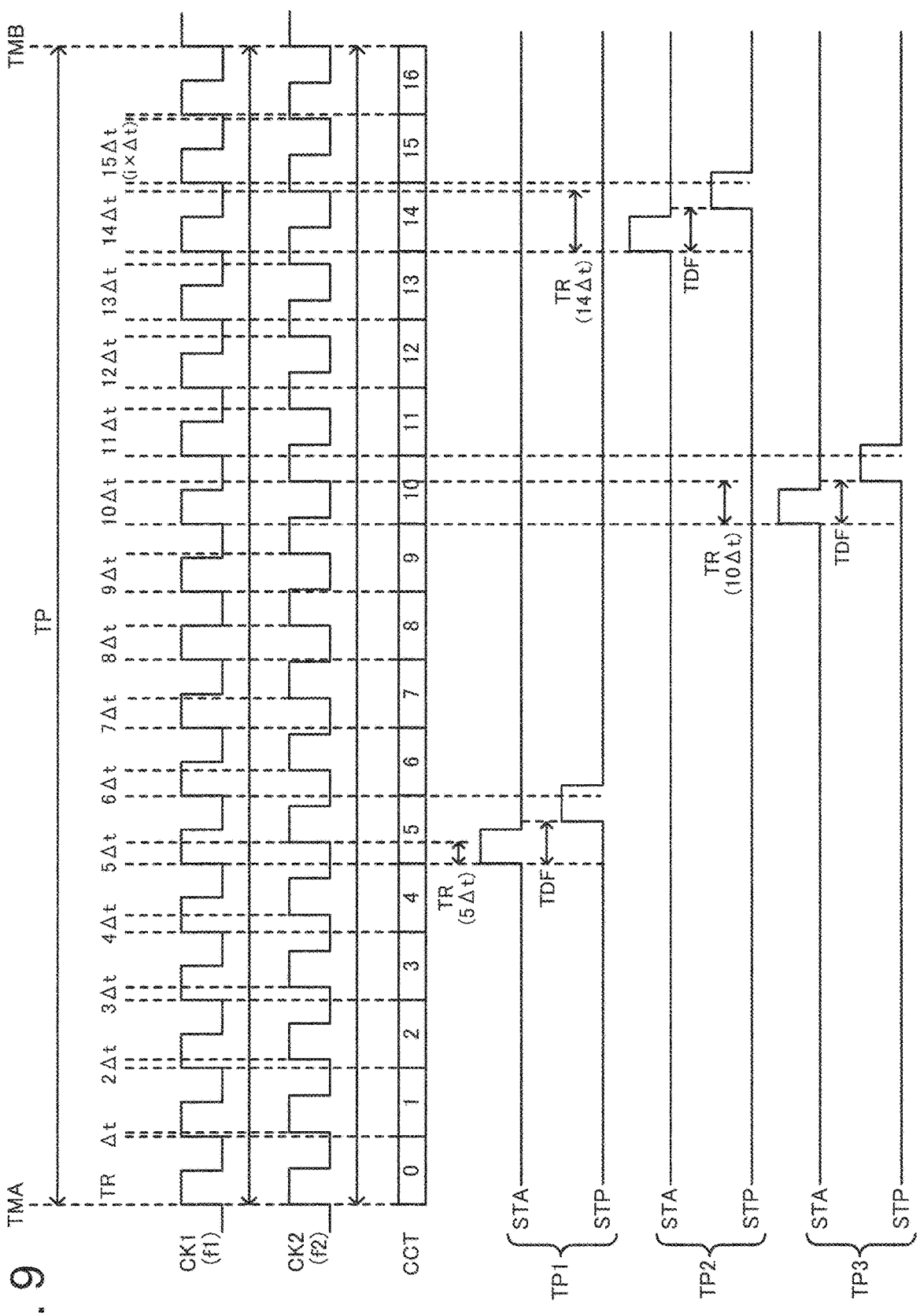
FIG. 9 is a signal waveform diagram illustrating a specific method of time-digital conversion.

FIG. 9 illustrates an example of a specific method of time-digital conversion in embodiment. For example, a period between the phase synchronization timings TMA and TMB is set to be an update period TP. Specifically, a period between first and second phase synchronization timings for the clock signals CK1 and CK2 is an update period TP1, a period between second and third phase synchronization timings is an update period TP2, and a period between third and fourth phase synchronization timings is an update period TP3.

In this case, the time-digital conversion circuit 20 generates the signal STA, for example, in the fifth clock cycle (m-th clock cycle and m is an integer of 1 or greater) in the update period TP1. Then, the time-digital conversion circuit 20 acquires the signal STP which corresponds to the generated signal STA and has a changed signal level. Processing of comparing the time difference TDF between the signals STA and STP in the fifth clock cycle to the time difference TR=5$\Delta t$ between clocks is performed. Here, the result of the comparison processing in that TDF is longer than TR=5$\Delta t$ is obtained.

The time-digital conversion circuit 20 generates the signal STA in the 14th clock cycle (n-th clock cycle and n is an integer of 1 or greater). Here, m and n are integers different from each other set in accordance with the result of the comparison processing in the update period TP1, in the update period TP2 next to the update period TP1. The time-digital conversion circuit 20 acquires the signal STP which corresponds to the generated signal STA and has a changed signal level. Processing of comparing TDF in the 14th clock cycle to TR=14$\Delta t$ is performed. Here, the result of the comparison processing in that TDF is longer than TR=14$\Delta t$ is obtained. For example, the result of comparison processing in that TDF is longer than TR=5$\Delta t$ is obtained in the update period TP1. Therefore, a clock cycle is set to cause TR to increase, in the next update period TP2.

The time-digital conversion circuit 20 generates the signal STA in the 10th clock cycle (CCT=10) set in accordance with the result of the comparison processing in the update period TP2, in the update period TP3 next to the update period TP2. Processing of comparing TDF in the 10th clock cycle to TR=10$\Delta t$ is performed. Here, the result of the comparison processing in that TDF is longer than TR=10$\Delta t$ is obtained. For example, the result of the comparison processing in that TDF is shorter than TR=14$\Delta t$ is obtained in the update period TP2. Thus, a clock cycle causing TR to be reduced is set, in the update period TP3. From the result of the above comparison processing, it is determined that the digital value DQ corresponding to the time difference TDF is a digital value corresponding to TR=10$\Delta t$.

As described above, in FIG. 9, feedback of the result of the comparison processing in the previous update period is performed so as to set a clock cycle for generating the signal STA in the current update period. Then, the comparison processing between TDF and TR is performed. As described above, it is possible to increase the speed of time-digital conversion by performing feedback of the result of the comparison processing in the previous update period. Even in a case where the time or the physical quantity as a measurement target changes dynamically, it is possible to realize time-digital conversion following the dynamic change.

Various modifications of time-digital conversion in the embodiment may be made. For example, a method (repetitive method) of obtaining the digital value DQ corresponding to the time difference TDF in a manner that the signal STA is generated plural times in one measurement period in which a time is measured and phase comparison is performed plural times (for example, 1000 times or greater) may be employed. Alternatively, in FIG. 9, a clock cycle designation value (clock cycle designation information) for designating a clock cycle in which the signal STA is generated is stored in the storage unit (register) of the circuit device 10. A method of obtaining the digital value DQ corresponding to the time difference TDF in a manner that processing of sequentially updating the clock cycle designation value stored in the storage unit is performed based on a result obtained by performing phase comparison between the signal STP and the clock signal CK2 in each of update periods TP1, TP2, TP3, . . . (method of updating a clock cycle designation value) may be employed. Alternatively, a method of obtaining the digital value DQ corresponding to the time difference TDF between the transition timings of the signals STA and STP, at resolution corresponding to the frequency difference between the clock frequencies f1 and f2 by binary search may be employed. Specifically, update of the clock cycle designation value based on the phase comparison result between the signal STP and the clock signal CK2 is realized by binary search. Alternatively, a search range of the digital value DQ may be narrowed by the method of binary search. Then, the signal STA may be generated for each clock cycle and phase comparison may be performed, by the method of updating the clock cycle designation value, in a period corresponding to the narrowed search range. Finally, the digital value DQ may be obtained. Alternatively, the digital value DQ corresponding to the time difference TDF between the transition timings of the signals STA and STP may be obtained based on the clock signals CK1 and CK2 generated by the resonators XTAL2 and XTAL3 and the signal STA which is input from the outside of the circuit device 10 instead of spontaneously generating the signal STA in the circuit device 10. For example, time-digital conversion may be performed while the oscillation circuits 102 and 103 perform an oscillation operation of the resonators XTAL2 and XTAL3 in a free run manner.

6. Detailed Configuration Example of Circuit Device

Figure 10:
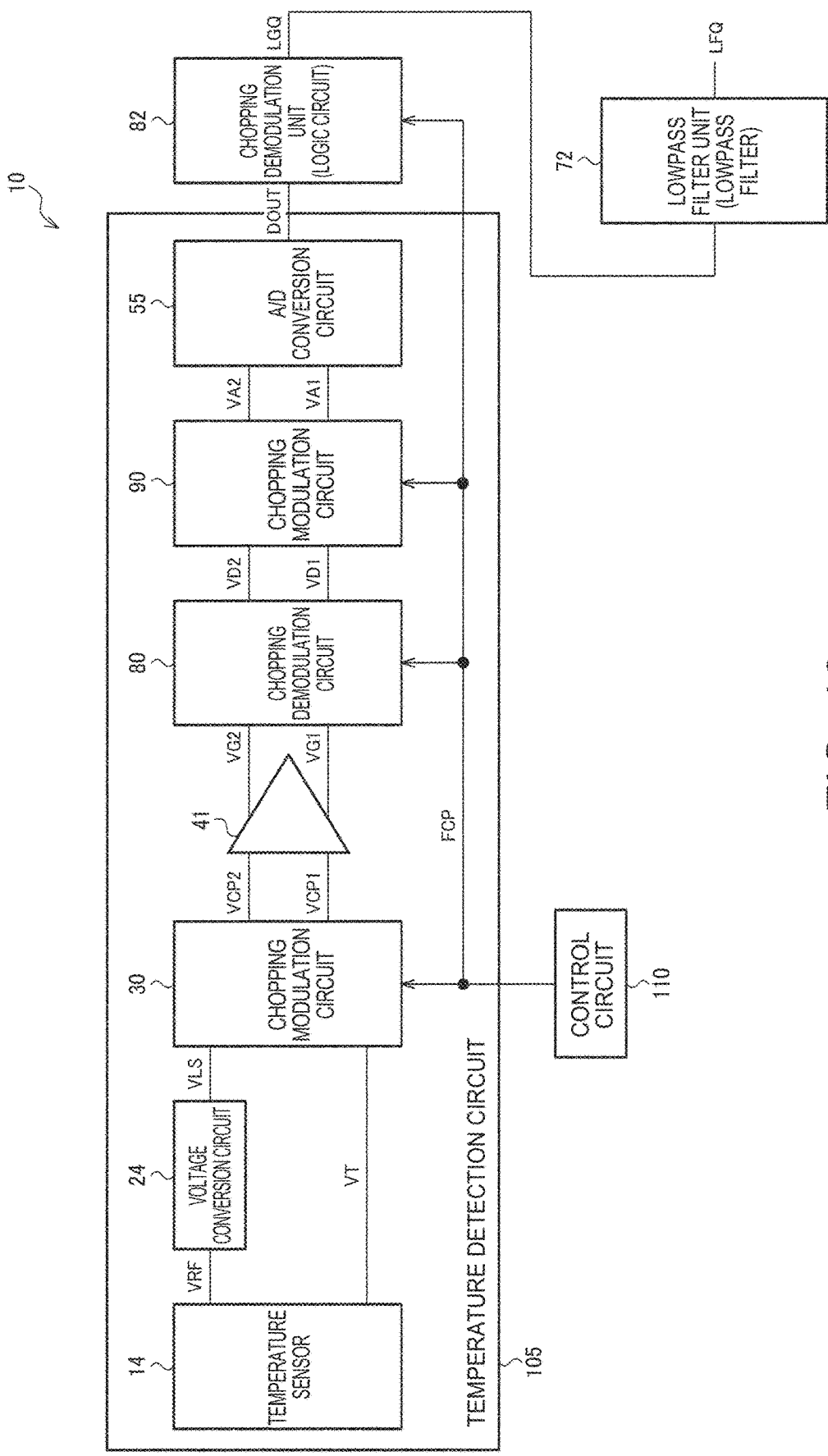
FIG. 10 illustrates a first detailed configuration example of the circuit device and the resonator device.

FIG. 10 illustrates a first detailed configuration example of the circuit device. FIG. 10 mainly illustrates a configuration example of the temperature detection circuit 105 including the temperature sensor 14. The circuit device 10 in FIG. 10 includes the temperature detection circuit 105, the chopping demodulation unit (logic circuit) 82, the lowpass filter unit (lowpass filter) 72, and the control circuit 110 (chopping control unit).

The temperature sensor 14 outputs a first voltage VT having temperature characteristics and a second voltage VRF as a reference voltage. That is, the temperature sensor 14 detects (measures) the temperature of a measurement target and outputs a detection result as a difference between the first voltage VT and the second voltage VRF. The first voltage VT is a voltage having a voltage value which changes in accordance with the detected temperature. For example, the first voltage linearly changes with the temperature. The second voltage VRF is a voltage having a constant voltage value without depending on the temperature. The first voltage VT using the second voltage VRF as the reference serves as a voltage indicating the detected temperature.

A voltage conversion circuit 24 converts the second voltage VRF to a third voltage VLS which is a voltage between an upper limit voltage and a lower limit voltage in temperature characteristics of the first voltage VT. The first voltage VT has a voltage value which changes in a voltage range between the lower limit voltage and the upper limit voltage, when the temperature changes in a given temperature range. The given temperature range is a temperature range assumed in an environment in which the circuit device 10 is used. For example, as the given temperature range, a temperature range defined in product specifications of the circuit device 10, or a temperature range used in examination of the circuit device 10 is provided. A difference between the third voltage VLS and the first voltage VT changes in a voltage range including 0 V by performing such voltage shift. For example, the voltage conversion circuit 24 is a resistance dividing circuit. The third voltage VLS is output by the resistance dividing circuit dividing a voltage section between the second voltage VRF and the reference voltage (for example, ground voltage).

The chopping modulation circuit (chopper circuit) 30 performs modulation by chopping (analog processing) on the first voltage VT and the third voltage VLS and outputs a first output voltage VCP1 and a second output voltage VCP2 after the modulation by chopping. Modulation by chopping means modulation by differential chopping. That is, an input signal is modulated by performing switching between a state where the input signal is output in a non-inverted state and a state where the input signal is inverted and then output, at a given frequency (chopping frequency). For example, the chopping modulation circuit 30 is realized by an analog switching circuit.

An amplifier circuit 41 performs amplification by using a signal of the first output voltage VCP1 and a signal of the second output voltage VCP2 as differential signals. The chopping demodulation circuit 80 is provided at the post stage of the amplifier circuit 41 and performs demodulation (analog processing) for chopping. Specifically, the amplifier circuit 41 outputs a voltage VG1 and a voltage VG2 after the amplification. For example, the amplifier circuit 41 is a programmable gain amplifier that is capable of variably setting the gain by register setting or the like. The chopping demodulation circuit 80 performs demodulation for chopping on the voltage VG1 and the voltage VG2 and outputs a voltage VD1 and a voltage VD2 after the demodulation. Demodulation for chopping is demodulation by differential chopping. That is, switching is performed such that a state (normal phase, reverse phase) of a differential signal, which is switched by modulation by chopping is brought back to a state (normal phase) before the modulation. For example, the chopping demodulation circuit 80 is realized by an analog switching circuit.

The chopping modulation circuit 90 is provided at the pre-stage of an A/D conversion circuit 55, which is the post stage of the chopping demodulation circuit 80. The chopping modulation circuit performs modulation by chopping (analog processing). The chopping modulation circuit 90 performs modulation by chopping on the voltage VD1 and the voltage VD2 from the chopping demodulation circuit 80. The voltage after the modulation is input to the A/D conversion circuit 55, as a first input voltage VA1 and a second input voltage VA2. For example, the chopping modulation circuit 90 is realized by an analog switching circuit.

The signal of the first input voltage VA1 and the signal of the second input voltage VA2 are input to the A/D conversion circuit 55 as differential signals, based on the first output voltage VCP1 and the second output voltage VCP2.

The A/D conversion circuit 55 performs A/D conversion by using the signal of the first input voltage VA1 and the signal of the second input voltage VA2 as differential signals. The A/D conversion circuit outputs A/D conversion data DOUT after the conversion. As an A/D conversion method, for example, a successive approximation type, a flash type, a pipeline type, a double integral type, or the like can be employed.

The chopping demodulation unit 82 performs digital processing of demodulation for chopping, on the A/D conversion data DOUT of the A/D conversion circuit 55. The demodulated A/D conversion data DOUT is output as output data LGQ. The chopping modulation circuit 30 repeats the first state (normal phase) and the second state (reverse phase) at a given frequency. Thus, the A/D conversion data DOUT obtained by performing A/D conversion on the input signals (VA1 and VA2) based on the output signal also comes to a modulated signal. The chopping demodulation unit 82 performs demodulation for chopping by reversing the sign (positive or negative) of the A/D conversion data DOUT when the chopping modulation circuit 30 is in the second state (reverse phase).

The lowpass filter unit 72 performs lowpass filter processing by digital signal processing, on the output data LGQ of the chopping demodulation unit 82. The lowpass filter unit outputs the output data LGQ after the processing, as temperature detection data LFQ. As the lowpass filter unit 72, various filters such as a FIR filter (for example, moving average filter) and an IIR filter (for example, Butterworth filter and Chebyshev filter) may be employed. A cutoff frequency is set to be a frequency lower than the chopping frequency.

The control circuit 110 controls modulation by chopping and demodulation for chopping. That is, the control circuit outputs a control signal FCP indicating a state (normal phase, reverse phase) of chopping to the chopping modulation circuit 30 and the chopping demodulation unit 82. The control circuit 110 is included in the digital processing circuit 180 of the processing circuit 12, for example. The chopping modulation circuits 30 and 90 switch the differential signal between the normal phase (non-inverted state) and the reverse phase (inverted state) in accordance with a state indicated by the control signal FCP. The chopping demodulation circuit 80 performs demodulation for chopping by switching the differential signal between the normal phase (non-inverted state) and the reverse phase (inverted state) in accordance with the state indicated by the control signal FCP. The chopping demodulation unit 82 performs demodulation for chopping by switching (inverting the sign in a case of the reverse phase) the sign of the A/D conversion data DOUT in accordance with the state indicated by the control signal FCP.

Figure 11:
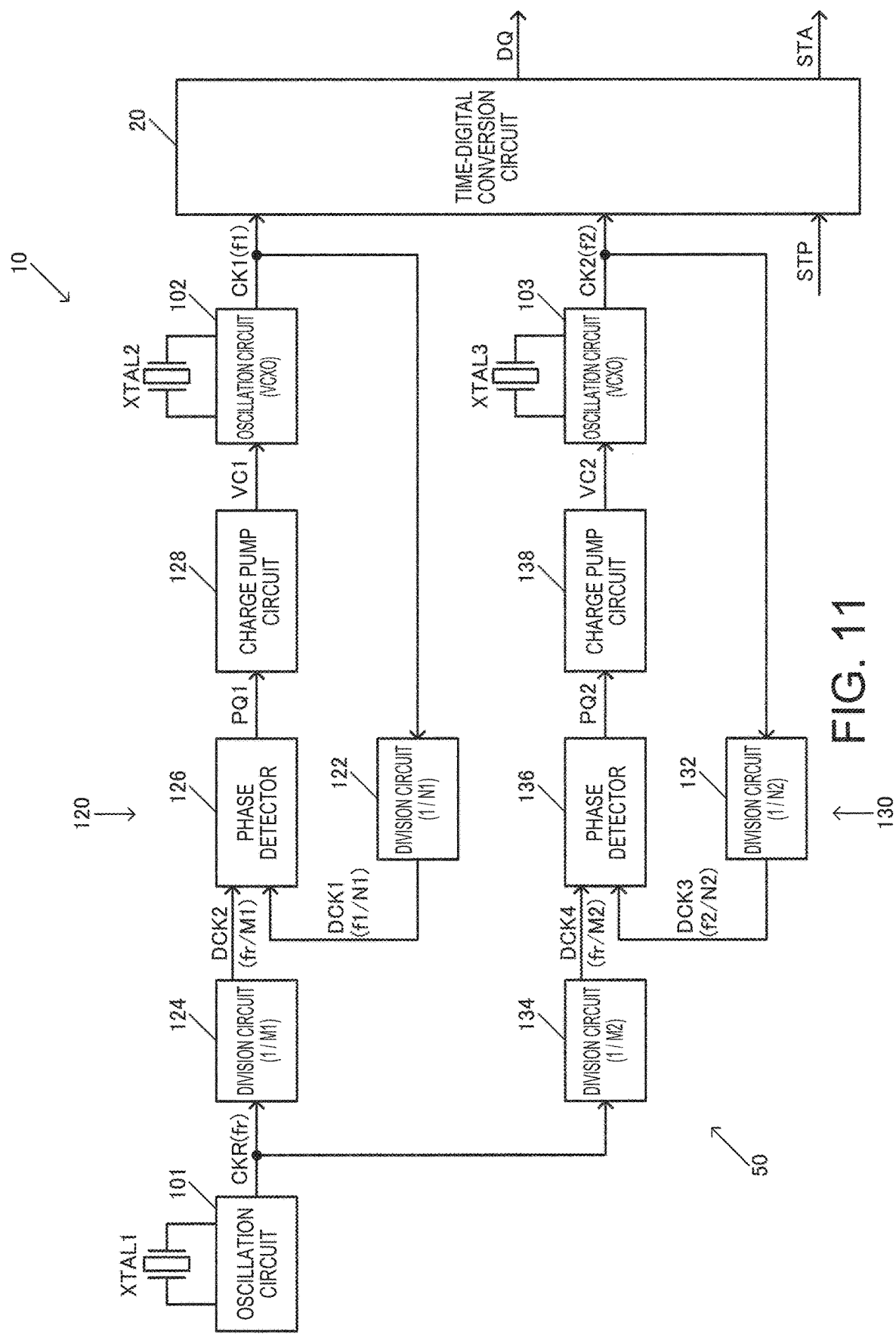
FIG. 11 illustrates a second detailed configuration example of the circuit device and the resonator device.

FIG. 11 illustrates a second detailed configuration example of the circuit device 10. FIG. 11 mainly illustrates a configuration example of the PLL circuits 120 and 130. The circuit device 10 in FIG. 11 includes the PLL circuit (first PLL circuit) 120 and the PLL circuit (second PLL circuit) 130. The PLL circuit 120 performs phase synchronization between the clock signal CK1 and the reference clock signal CKR. The PLL circuit 130 performs synchronization between the clock signal CK2 and the reference clock signal CKR. The circuit device 10 includes the oscillation circuit 101 that oscillates the resonator XTAL1.

Specifically, the PLL circuit 120 performs phase synchronization between the clock signal CK1 and the reference clock signal CKR (causes the transition timings thereof to coincide with each other) for each first phase synchronization timing (for each first period). The PLL circuit 130 performs phase synchronization between the clock signal CK2 and the reference clock signal CKR (causes the transition timings thereof to coincide with each other) for each second phase synchronization timing (for each second period). Thus, phase synchronization between the clock signals CK1 and CK2 is performed. Here, the clock frequency fr of the reference clock signal CKR is a frequency different from the clock frequencies f1 and f2 of the clock signals CK1 and CK2. For example, the clock frequency fr is lower than the clock frequencies f1 and f2.

The PLL circuit 120 includes the division circuits 122 and 124 and the phase detector 126. The division circuit 122 divides the clock frequency f1 of the clock signal CK1 by N1 and outputs a divided clock signal DCK1 having a clock frequency of f1/N1. The division circuit 124 divides the clock frequency fr of the reference clock signal CKR by M1 and outputs a divided clock signal DCK2 having a clock frequency of fr/M1. The phase detector 126 performs phase comparison between DCK1 and DCK2 and outputs a signal PQ1 which is an up or down signal, to a charge pump circuit 128. The oscillation circuit (VCXO) 102 generates the clock signal CK1 by performing an oscillation operation of the resonator XTAL2 having an oscillation frequency which is controlled based on a control voltage VC1 from the charge pump circuit 128.

The PLL circuit 130 includes division circuits 132 and 134 and a phase detector 136. The division circuit 132 divides the clock frequency f2 of the clock signal CK2 by N2 and outputs a divided clock signal DCK3 having a clock frequency of f2/N2. The division circuit 134 divides the clock frequency fr of the reference clock signal CKR by M2 and outputs a divided clock signal DCK4 having a clock frequency of fr/M2. The phase detector 136 performs phase comparison between DCK3 and DCK4 and outputs a signal PQ2 which is an up or down signal, to the charge pump circuit 138. The oscillation circuit (VCXO) 103 generates the clock signal CK2 by performing an oscillation operation of the resonator XTAL3 having an oscillation frequency which is controlled based on a control voltage VC2 from the charge pump circuit 138.

Figure 12:
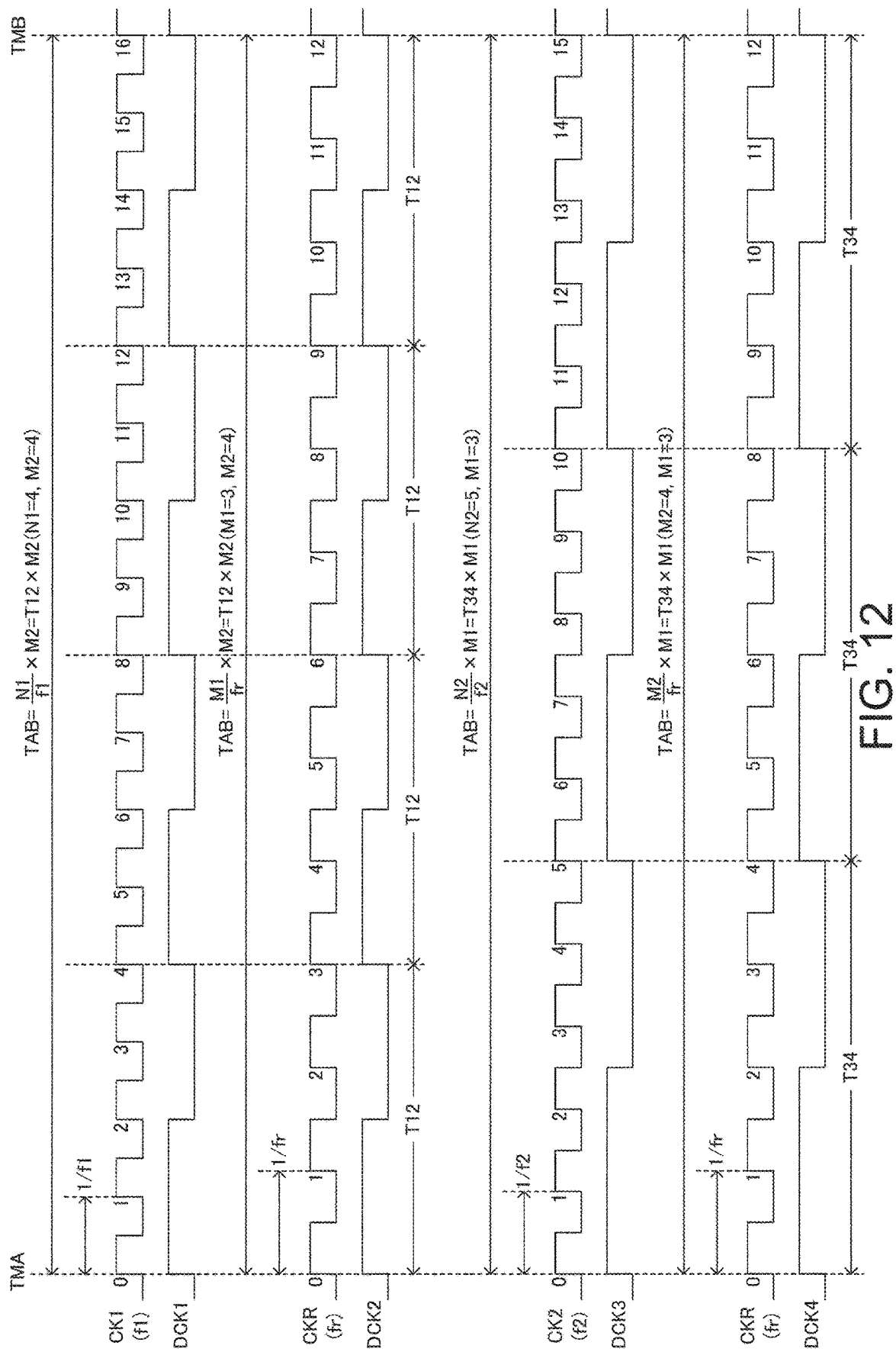
FIG. 12 is a signal waveform diagram illustrating time-digital conversion in the detailed configuration example.

FIG. 12 is a signal waveform diagram illustrating an operation of the circuit device 10 in FIG. 11. FIG. 12 illustrates an example in which N1=4, M1=3, N2=5, and M2=4 are set for simple descriptions. In practice, N1, M1, N2, and M2 are set to have very large values.

As illustrated in FIG. 12, a signal obtained by dividing CK1 by N1 (=4) corresponds to DCK1, a signal obtained by dividing CKR by M1 (=3) corresponds to DCK2, and phase synchronization is performed for each period T12. That is, T12=N1/f1=M1/fr is satisfied. A signal obtained by dividing CK2 by N2 (=5) corresponds to DCK3, a signal obtained by dividing CKR by M2 (=4) corresponds to DCK4, and phase synchronization is performed for each period T34. That is, T34=N2/f2=M2/fr is satisfied. CK1 and CK2 are subjected to phase synchronization for each period TAB, and TAB=T12×M2=T34×M1 is satisfied.

For example, in a case where fr is 102 MHz, since the division ratio is set to be N1=102, M1=100, N2=103, and M2=102, f1 comes to 103.01 MHz and f2 comes to 103 MHz. Thus, the resolution in time-digital conversion can be set to $\Delta t=|1/f1-1/f2|=0.96$ ps (picoseconds) and it is possible to realize time-digital conversion having high resolution.

N1 and M1 are integers which are 2 or greater and are different from each other. N2 and M2 are also integers which are 2 or greater and are different from each other. At least one of N1 and M1 and at least one of N2 and M2 are integers different from each other. Desirably, for N1 and N2, the greatest common divisor is 1 and the least common multiple is N1×N2. For M1 and M2, the greatest common divisor is 1 and the least common multiple is M1×M2. In the embodiment, N1, M1, N2, and M2 are set to establish a relationship of |N1×M2−N2×M1|=1. According to this configuration, CK1 and CK2 are shifted for each period TAB by one clock cycle (one clock period) and thus it is possible to realize time-digital conversion by using the principle of a Vernier caliper.

In FIGS. 11 and 12, phase synchronization between CK1 and CKR is performed for each period T12 which is shorter than the period TAB, and phase synchronization between CK2 and CKR is performed for each period T34 which is shorter than the period TAB. Thus, in comparison to a configuration example which will be described later and in which only one PLL circuit is provided, the frequency of performing phase comparison is increased and thus an occurrence of jitter (cumulative jitter) or phase noise in the clock signals CK1 and CK2 is reduced.

The PLL circuits 120 and 130 in FIG. 11 have a circuit configuration of an analog type. However, a circuit configuration of a digital type (ADPLL) may be employed. In this case, it is possible to embody each of the PLL circuits (120 and 130) by a phase detector, a digital computation unit, and the like. The phase detector includes a counter and a TDC. The counter generates digital data corresponding to an integer part of a result obtained by dividing the clock frequency (fr) of the reference clock signal (CKR) by the clock frequency (f1, f2) of the clock signal (CK1, CK2). The TDC generates digital data corresponding to a decimal part of the division result. Digital data corresponding to a result obtained by adding the integer part and the decimal part is output to the digital computation unit. The digital computation unit detects a phase error from setting frequency data based on setting frequency data and digital data of a comparison result from the phase detector. Then, the digital computation unit generates frequency control data by performing smoothing processing of the detected phase error and outputs the generated frequency control data to the oscillation circuit (102, 103). The oscillation circuit generates a clock signal (CK1, CK2) having an oscillation frequency which is controlled based on the frequency control data.

Figure 13:
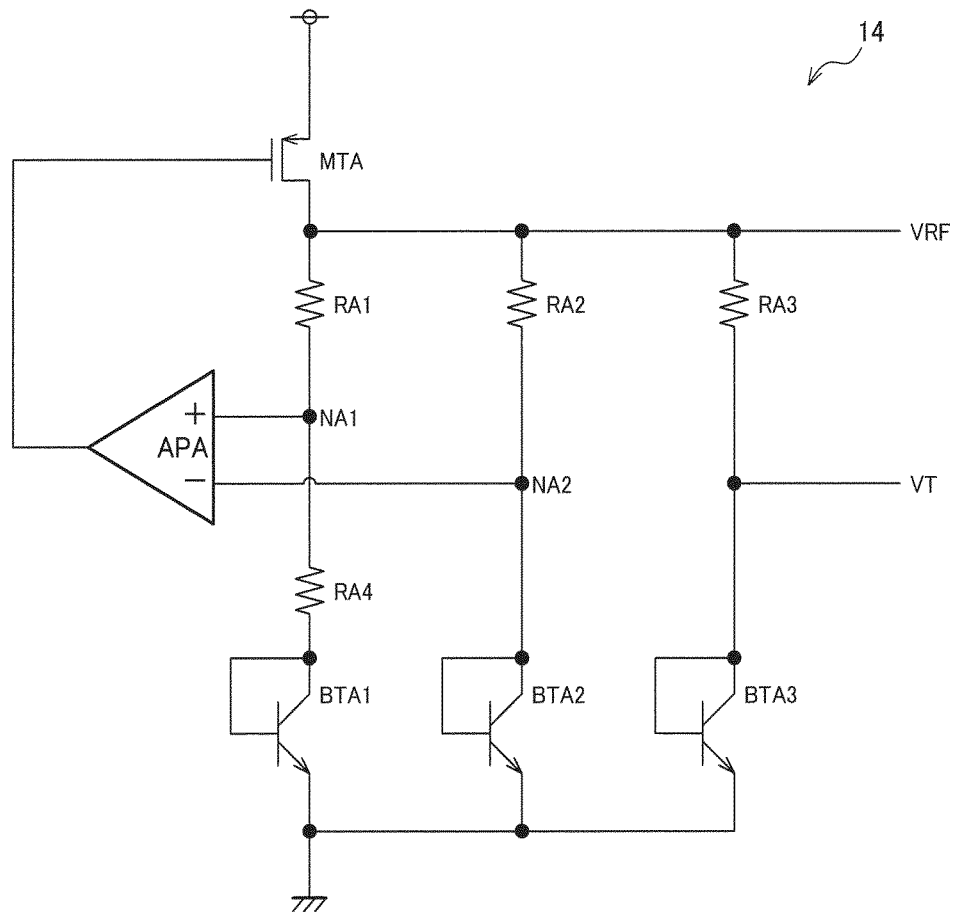
FIG. 13 illustrates a detailed configuration example of a temperature sensor.

FIG. 13 illustrates a detailed configuration example of the temperature sensor. The temperature sensor 14 in FIG. 13 includes resistive elements (resistors) RA1 to RA4, bipolar transistors BTA1 to BTA3, an amplifier circuit APA, and a P-type transistor MTA.

The amplifier circuit APA performs feedback control via the P-type transistor MTA such that the potentials at input nodes NA1 and NA2 are equal to each other. The size ratio between the bipolar transistors BTA1 and BTA2 is set to cause the temperature characteristics of a base-emitter voltage to be canceled. A voltage which does not have temperature characteristics is output as the second voltage (reference voltage) VRF. The first voltage VT is a base-emitter voltage of the bipolar transistor BTA3. Since the base-emitter voltage has negative temperature characteristics, the first voltage VT has temperature characteristics.

In FIGS. 1 and 2, for example, the resistive element (resistors) RA1 to RA4, the bipolar transistor BTA1 to BTA3, the amplifier circuit APA, and the P-type transistor MTA are disposed below the first resonator XTAL1. The configuration, however, is not limited thereto and, for example, at least the bipolar transistor BTA3 is disposed below the first resonator XTAL1 (for example, the oscillation electrode). The bipolar transistor BTA3 is a circuit element that outputs the first voltage VT having temperature characteristics. It is desirable for the bipolar transistor BTA3 to be disposed below (overlapped by) the first resonator XTAL1.

In the above descriptions, an example in which the temperature sensor 14 is a band gap reference circuit is described, but it is not limited thereto. The temperature sensor 14 may be a circuit that detects the temperature by using temperature characteristics of a circuit element. For example, the temperature sensor 14 may be a temperature sensor using the temperature characteristics of a forward voltage of a diode, for example.

Figure 14:
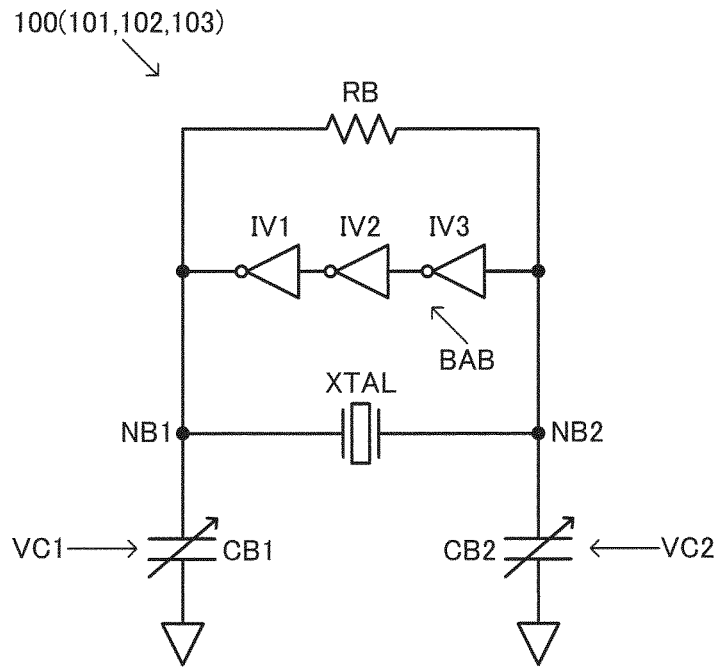
FIG. 14 illustrates a first configuration example of an oscillation circuit.

FIG. 14 illustrates a first configuration example of the oscillation circuit 100. Here, the oscillation circuit 100 is described as the representative of the oscillation circuits 101, 102, and 103. The oscillation circuit 100 in FIG. 14 includes an oscillation buffer circuit BAB, variable capacitance circuits CB1 and CB2 (capacitors) and a feedback resistor RB. The buffer circuit BAB can be configured by an inverter circuit having one or a plurality of stages (odd number stages). In FIG. 14, the buffer circuit BAB is configured by an inverter circuit having three stages (IV1, IV2, and IV3). The buffer circuit BAB (IV1 to IV3) may be a circuit capable of controlling enabling or disabling of oscillation or controlling a current to flow.

The variable capacitance circuits CB1 and CB2 are provided at one end (NB1) and the other end (NB2) of the resonator XTAL, respectively. The feedback resistor RB is provided between the one end and the other end of the resonator XTAL. The variable capacitance circuits CB1 and CB2 control the capacitance values based on control voltages (control signal) VC1 and VC2. The variable capacitance circuits CB1 and CB2 are realized by variable capacitance diodes (varactors) or the like. As described above, it is possible to adjust the oscillation frequency of the oscillation circuit 100 by controlling the capacitance value.

Figure 15:
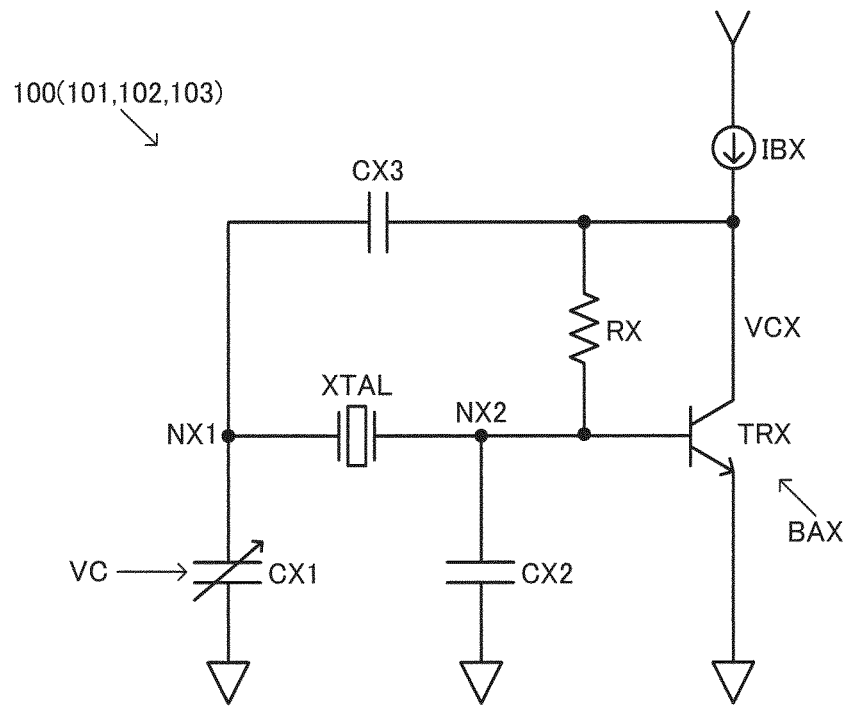
FIG. 15 illustrates a second configuration example of the oscillation circuit.

FIG. 15 illustrates a second configuration example of the oscillation circuit 100. The oscillation circuit 100 includes a current source IBX, a bipolar transistor TRX, a resistor RX, capacitors CX2 and CX3, and a variable capacitance circuit CX1 (variable capacitor). For example, the oscillation buffer circuit BAX is configured by the current source IBX, the bipolar transistor TRX, the resistor RX, and the capacitor CX3. The current source IBX supplies a bias current to a collector of the bipolar transistor TRX. The resistor RX is provided between the collector and a base of the bipolar transistor TRX. One end of the variable capacitance circuit CX1 in which capacitance is variable is connected to one end (NX1) of the resonator XTAL via the terminal of the circuit device 10 for the first resonator (pad for the resonator). One end of the capacitor CX2 is connected to the other end (NX2) of the resonator XTAL via the terminal of the circuit device 10 for the second resonator (pad for the resonator). One end of the capacitor CX3 is connected to one end of the resonator XTAL and the other end of the capacitor CX3 is connected to the collector of the bipolar transistor TRX.

A base-emitter current generated by oscillating the resonator XTAL flows in the bipolar transistor TRX. If the base-emitter current increases, a collector-emitter current of TRX increases and a collector voltage VCX decreases. If the base-emitter current of TRX decreases, the collector-emitter current decreases and the collector voltage VCX increases. The collector voltage VCX is fed back to the one end of the resonator XTAL via the capacitor CX3. That is, an AC component is cut off by the capacitor CX3 and a DC component is fed back. As described above, the oscillation buffer circuit BAX configured by the bipolar transistor TRX and the like operates as an inverting circuit (inverting amplifier circuit) that outputs an inverted signal (signal having a phase difference of 180 degrees from) of a signal at a node NX2, to a node NX1. The capacitance value of the variable capacitance circuit CX1 configured by the variable capacitance diode and the like is controlled based on the control voltage VC. Thus, the oscillation frequency of the oscillation circuit 100 may be adjusted.

The oscillation circuit 100 is not limited to the configurations in FIGS. 14 and 15. Various modifications may be made. For example, the capacitance values of the variable capacitance circuits (CB1, CB2, and CX1) can be adjusted by using digital values. In this case, the variable capacitance circuit is configured by a plurality of capacitors (capacitor array) and a plurality of switching elements (switching array). ON and OFF of each of the switching elements are controlled based on frequency control data having a digital value.

7. Shield Line

Figure 16:
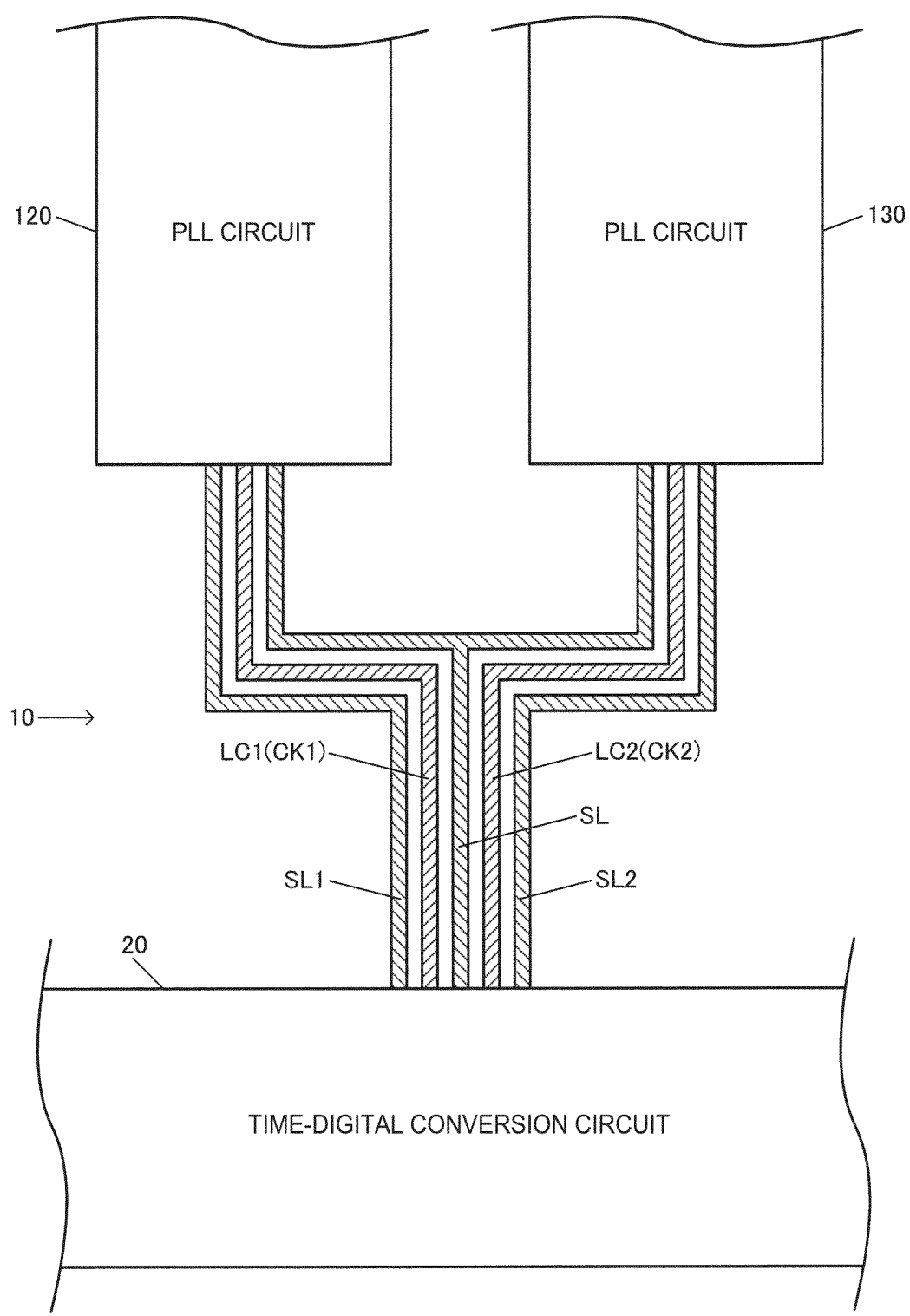
FIG. 16 is a diagram illustrating a method of disposing a shield line.

Next, a method of disposing a shield line in cooperation with the signal lines of the clock signals CK1 and CK2 will be described. For example, as illustrated in FIG. 16, the circuit device 10 includes a signal line (first signal line) LC1 and a signal line (second signal line) LC2. The signal line LC1 is used for supplying the clock signal CK1 to the time-digital conversion circuit 20. The signal line LC2 is used for supplying the clock signal CK2 to the time-digital conversion circuit 20. Specifically, the signal line LC1 is, for example, a signal line for connecting the PLL circuit 120 (oscillation circuit 102) and the time-digital conversion circuit 20. The signal line LC2 is, for example, a signal line for connecting the PLL circuit 130 (oscillation circuit 103) and the time-digital conversion circuit 20. The signal line LC1 is disposed from the PLL circuit 120 disposed on the left side in FIG. 16 toward a signal input node at the center of the time-digital conversion circuit 20, and is bent at two corners. The signal line LC2 is disposed from the PLL circuit 130 disposed on the right side toward the signal input node at the center of the time-digital conversion circuit 20, and is bent at two corners.

A shield line SL (first shield line) is disposed between the signal lines LC1 and LC2. For example, the signal lines LC1 and LC2 become closer to each other after the signal lines LC1 and LC2 bend at the second corners. However, the shield line SL is disposed between the signal lines LC1 and LC2 in a place in which the signal lines LC1 and LC2 become close to each other. If the shield line SL is disposed in this manner, it is possible to reduce an occurrence of coupling between the clock signals CK1 and CK2 transmitted by the signal lines LC1 and LC2. Thus, for example, it is possible to reduce a negative influence applied by transferring clock noise of the clock signal CK1 to the clock signal CK2 or a negative influence applied by transferring clock noise of the clock signal CK2 to the clock signal CK1, by the shield line SL. Accordingly, it is possible to reduce noise such as jitter noise occurring in the clock signals CK1 and CK2 and to improve performance of time-digital conversion in the time-digital conversion circuit 20.

As illustrated in FIG. 16, the circuit device 10 further includes a shield line (second shield line) SL1 and a shield line (third shield line) SL2. The signal line LC1 is disposed between the shield line SL1 and the shield line SL and the signal line LC2 is disposed between the shield line SL2 and the shield line SL. According to this configuration, it is possible to dispose the shield lines SL1 and SL on both sides of the signal line LC1 and to dispose the shield lines SL2 and SL on both sides of the signal line LC2. In this case, it is possible to reduce a negative influence of clock noise of one clock signal on the other clock signal by the shield line SL. It is possible to reduce a negative influence of noise (external noise) other than the clock noise on the clock signal CK1 by the shield line SL1. It is possible to reduce a negative influence of noise (external noise) other than the clock noise on the clock signal CK2 by the shield line SL2. Thus, the performance of time-digital conversion in the time-digital conversion circuit 20 is further improved.

8. Modification Example

Figure 17:
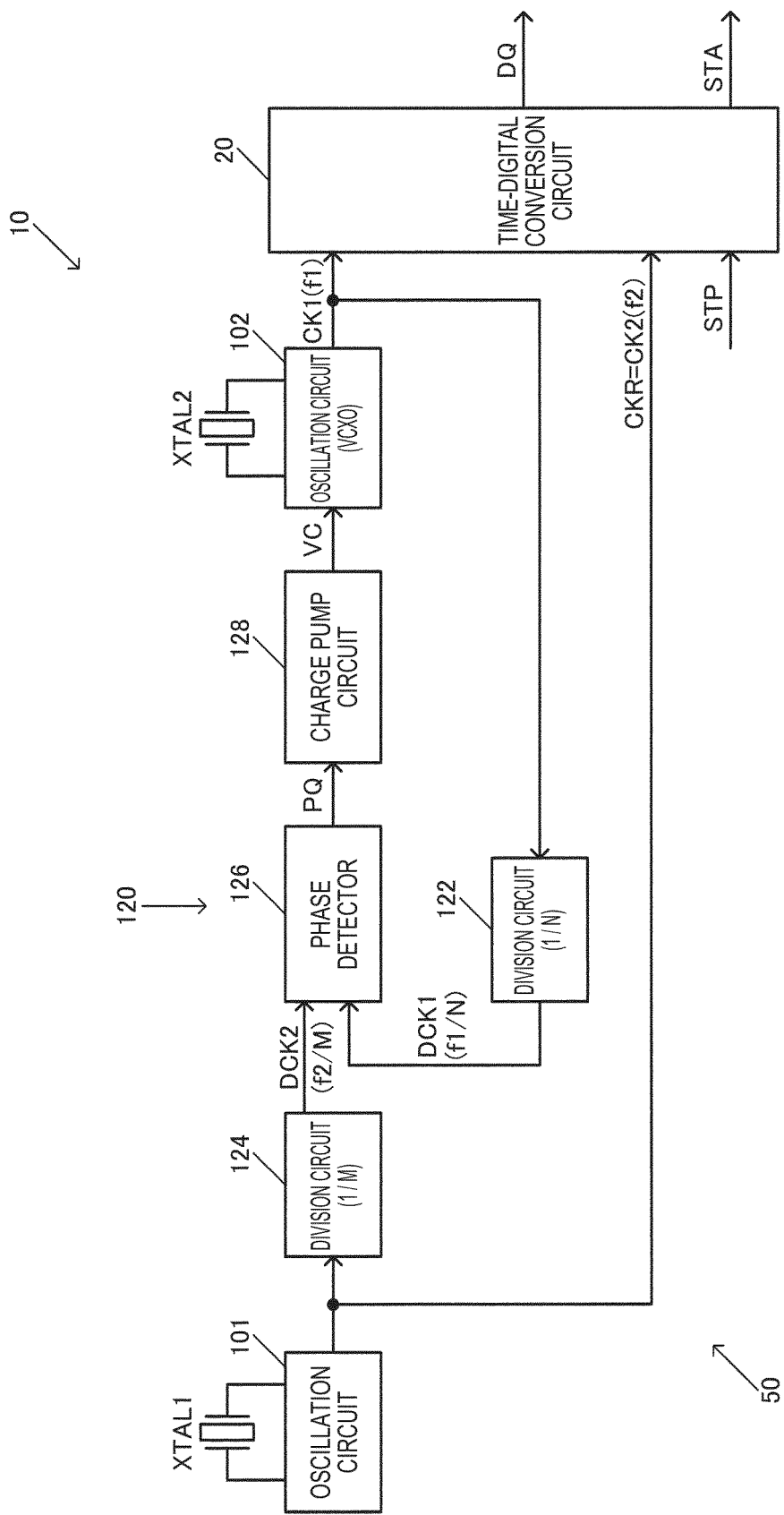
FIG. 17 illustrates a modification example of the embodiment.

Next, various modification examples of the embodiment will be described. For example, in the embodiment, a case of providing the three resonators XTAL1 to XTAL3 is mainly described. However, the embodiment is not limited thereto. The number of resonators may be 2 or may be 4 or greater. For example, in the modification example of the embodiment in FIG. 17, the two resonators XTAL1 and XTAL2 and one PLL circuit 120 are provided.

For example, the PLL circuit 120 performs phase synchronization between the clock signals CK1 and CK2. Specifically, in a case where the clock frequencies of the clock signals CK1 and CK2 are set to f1 and f2, the PLL circuit 120 performs phase synchronization between the clock signals CK1 and CK2 so as to satisfy N/f1=M/f2 (N and M are integers of 2 or greater, which are different from each other). The PLL circuit 120 includes the division circuits 122 and 124 and the phase detector 126. The division circuit 122 divides the clock frequency f1 of the clock signal CK1 by N and outputs a divided clock signal DCK1 having a clock frequency of f1/N. The division circuit 124 divides the clock frequency f2 of the clock signal CK2 by M and outputs a divided clock signal DCK2 having a clock frequency of f2/M. For example, the circuit device 10 includes the oscillation circuit 101. The oscillation circuit 101 oscillates the resonator XTAL1 to generate the clock signal CK2 (reference clock signal CKR) and outputs the generated clock signal CK2 to the division circuit 124. The phase detector 126 performs phase comparison between the divided clock signal DCK1 and the divided clock signal DCK2. With this configuration, it is possible to perform phase synchronization between the clock signals CK1 and CK2 for each phase synchronization timing.

9. Electronic Apparatus and Vehicle

Figure 18:
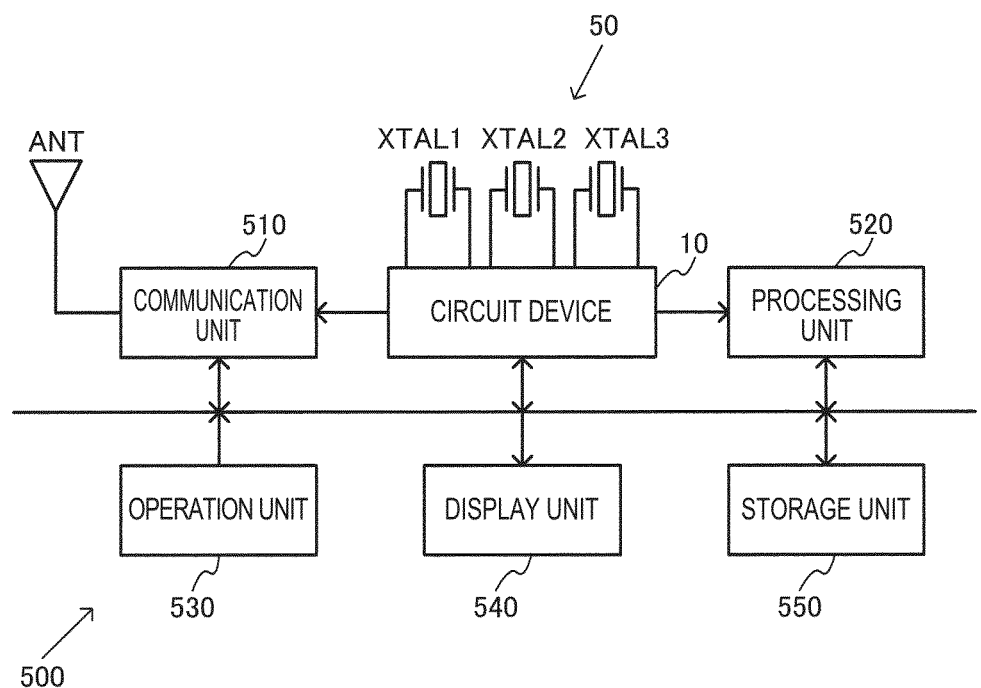
FIG. 18 illustrates a configuration example of an electronic apparatus.

FIG. 18 illustrates a configuration example of an electronic apparatus including the resonator device 50 (circuit device) in the embodiment. An electronic apparatus 500 includes the resonator device 50 including the circuit device 10 and the resonators XTAL1 to XTAL3, and a processing unit 520. The electronic apparatus 500 may include a communication unit 510, an operation unit 530, a display unit 540, a storage unit 550, and an antenna ANT.

As the electronic apparatus 500, for example, the followings can be assumed: a measuring device that measures the physical quantity such as a distance, a time, a flow rate, and a flow quantity; a biological information measuring device that measures biological information (ultrasonic measuring device, pulse wave meter, blood pressure measuring device, and the like); an in-vehicle device (device for automatic driving and the like); and a network-related device such as a base station or a router. In addition, the followings can be assumed: a wearable device such as a head-mounted display device or a clock-related device; a robot, a printing device, a projection device, a portable information terminal (such as a smartphone), a content providing device that distributes contents; and a video device such as a digital camera or a video camera.

The communication unit (wireless circuit) 510 performs processing of receiving data from the outside of the apparatus or transmitting data to the outside, via the antenna ANT. The processing unit (processing circuit) 520 performs control processing of the electronic apparatus 500 or various kinds of digital processing of data transmitted and received via the communication unit 510. The function of the processing unit 520 may be realized by a processor such as a microcomputer, for example. The operation unit 530 is used when a user performs an input operation. The operation unit 530 may be realized by an operation button, a touch panel display, and the like. The display unit 540 displays various kinds of information and may be realized by a display of liquid crystal, organic EL, or the like. The storage unit 550 stores data. The function thereof may be realized by a semiconductor memory (such as a RAM or a ROM), an HDD (hard disk drive), or the like.

Figure 19:
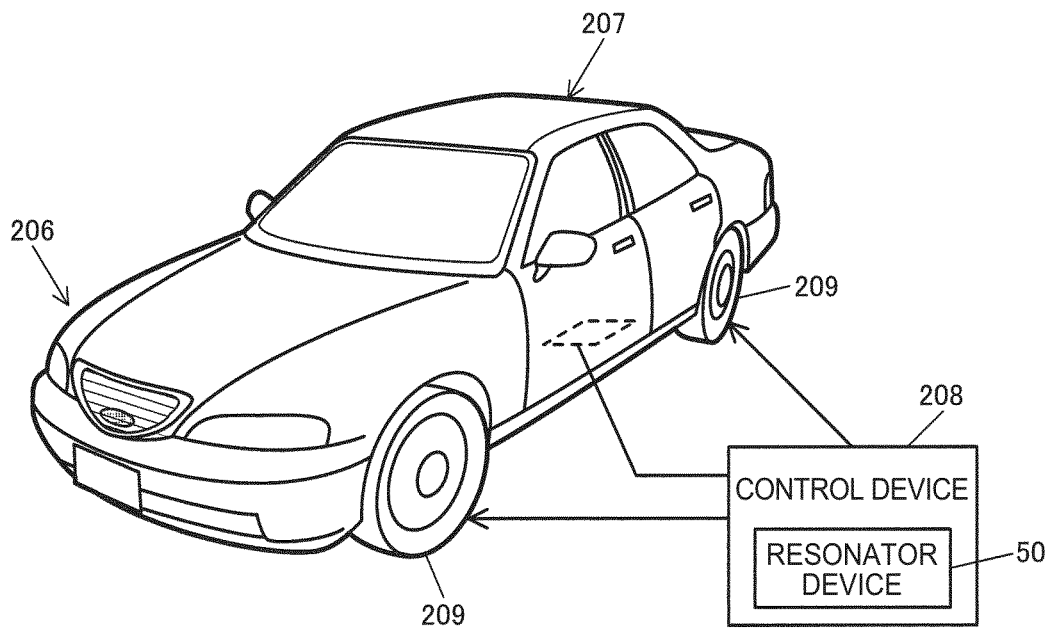
FIG. 19 illustrates a configuration example of a vehicle.

FIG. 19 illustrates an example of a vehicle including the resonator device 50 (circuit device) in the embodiment. The resonator device 50 (oscillator, physical quantity measurement device) in the embodiment can be incorporated into various vehicles such as cars, airplanes, motorcycles, bicycles, robots, and ships. The vehicle is an apparatus or a device that includes a driving mechanism such as an engine and a motor, a steering mechanism such as a steering wheel and a rudder, and various kinds of electronic apparatuses (in-vehicle apparatuses) and moves on the ground, the sky, or the sea. FIG. 19 schematically illustrates an automobile 206 as a specific example of the vehicle. The resonator device 50 in the embodiment is incorporated into the automobile 206. A control device 208 performs various kinds of control processing based on the clock signal generated by the resonator device 50 or physical quantity information measured by the resonator device 50. For example, in a case where distance information of an object around the automobile 206 is measured as the physical quantity information, the control device 208 performs various kinds of control processing for automatic driving, by using the measured distance information. The control device 208 controls the hardness of a suspension in accordance with the posture of a vehicle body 207 or controls the break for each wheel 209. A device into which the resonator device 50 in the embodiment is incorporated is not limited to such a control device 208. The resonator device 50 can be incorporated into various devices provided in a vehicle such as the automobile 206 or a robot.

Hitherto, the embodiment is specifically described. However, those skilled in the related art can easily understand that many modifications can be made without substantially departing from the novel matters and effects of the invention. Thus, all such modification examples are included in the scope of the invention. For example, in the specification or the drawings, a term described together with a different term which is broader or equivalent can be replaced with the different term at any point in the specification or the drawings, at least once. In addition, all combinations of the embodiment and the modification examples are included in the scope of the invention. The configurations and operations of the resonator device, the electronic apparatus, and the vehicle, an arrangement configuration or a connection configuration of the circuit device and the resonator in the resonator device, the circuit configuration of the circuit device, and the processing and the like of the processing circuit are not limited to those described in the embodiment and various modifications can be made.

The entire disclosure of Japanese Patent Application No. 2017-145070 filed Jul. 27, 2017 is expressly incorporated by reference herein.

What is claimed is:

1. A resonator device comprising:
    a first resonator configured to generate a reference clock signal;
    a second resonator configured to generate a first clock signal, the first clock signal having a frequency adjusted based on the reference clock signal; and
    a circuit device that includes:
        a substrate; and
        a temperature sensor configured to perform temperature compensation of an oscillation frequency of the first resonator,
    wherein the first resonator is disposed on the circuit device so as to overlap the temperature sensor in a plan view,
    wherein the circuit device includes:
        a first oscillation circuit configured to generate the reference clock signal by using the first resonator; and
        a second oscillation circuit configured to generate the first clock signal by using the second resonator,
    the first resonator overlaps the temperature sensor and the first oscillation circuit in the plan view, and
    the second resonator overlaps the second oscillation circuit in the plan view.

2. The resonator device according to claim 1,
    wherein the first resonator is supported on the circuit device by a first support, and
    the second resonator is supported on the circuit device by a second support.

3. The resonator device according to claim 2,
    wherein the first support electrically connects a terminal electrode of the first resonator and a first terminal of the circuit device, and
    the second support electrically connects a terminal electrode of the second resonator and a second terminal of the circuit device.

4. The resonator device according to claim 2,
    wherein the first support and the second support are conductive bumps.

5. The resonator device according to claim 1,
    wherein a combined area of the first resonator and the second resonator is smaller than an area of the circuit device in the plan view.

6. The resonator device according to claim 1,
    wherein the circuit device includes a time-digital conversion circuit configured to convert a time to a digital value based on the reference clock signal and the first clock signal.

7. A resonator device comprising:
    a first resonator configured to generate a reference clock signal;
    a second resonator configured to generate a first clock signal, the first clock signal having a frequency adjusted based on the reference clock signal;
    a circuit device that includes:
        a substrate; and a temperature sensor configured to perform temperature compensation of an oscillation frequency of the first resonator,
wherein the first resonator is disposed on the circuit device so as to overlap the temperature sensor in a plan view; and
a third resonator configured to generate a second clock signal, the second clock signal having a frequency adjusted based on the reference clock signal.

8. The resonator device according to claim 7,
wherein the circuit device includes:
   a first PLL circuit configured to perform phase synchronization between the reference clock signal and the first clock signal; and
   a second PLL circuit configured to perform phase synchronization between the reference clock signal and the second clock signal.

9. The resonator device according to claim 7,
wherein the circuit device includes a time-digital conversion circuit configured to convert a time to a digital value based on the first clock signal and the second clock signal.

10. The resonator device according to claim 9,
wherein the circuit device includes:
   a first signal line through which the first clock signal is supplied to the time-digital conversion circuit; and
   a second signal line through which the second clock signal is supplied to the time-digital conversion circuit, and
a first shield line is physically disposed between the first signal line and the second signal line.

11. The resonator device according to claim 10,
wherein the circuit device includes the first shield line and a second shield line,
the first signal line is disposed between the second shield line and the first shield line, and
the second signal line is disposed between a third shield line and the first shield line.

12. A resonator device comprising:
a first resonator configured to generate a reference clock signal;
a second resonator configured to generate a first clock signal, the first clock signal having a frequency adjusted based on the reference clock signal; and
a circuit device that includes:
   a substrate; and
   a temperature sensor configured to perform temperature compensation of an oscillation frequency of the first resonator,
wherein the first resonator is supported on the circuit device by a first conductive bump that electrically connects a terminal electrode of the first resonator and a first terminal of the circuit device,
wherein the second resonator is supported on the circuit device by a second conductive bump that electrically connects a terminal electrode of the second resonator and a second terminal of the circuit device, and
wherein the circuit device includes:
   a first oscillation circuit configured to generate the reference clock signal by using the first resonator; and
   a second oscillation circuit configured to generate the first clock signal by using the second resonator,
the first resonator overlaps an entirety of the temperature sensor and at least part of the first oscillation circuit in a plan view, and
the second resonator overlaps at least part of the second oscillation circuit in the plan view.

13. The resonator device according to claim 12,
wherein a combined area of the first resonator and the second resonator is smaller than an area of the circuit device in the plan view.

14. The resonator device according to claim 12, further comprising:
a third resonator configured to generate a second clock signal, the second clock signal having a frequency adjusted based on the reference clock signal.

15. The resonator device according to claim 14,
wherein the circuit device includes:
   a first PLL circuit configured to perform phase synchronization between the reference clock signal and the first clock signal; and
   a second PLL circuit configured to perform phase synchronization between the reference clock signal and the second clock signal.

16. The resonator device according to claim 14,
wherein the circuit device includes a time-digital conversion circuit configured to convert a time to a digital value based on the first clock signal and the second clock signal.

17. The resonator device according to claim 12,
wherein the circuit device includes a time-digital conversion circuit configured to convert a time to a digital value based on the reference clock signal and the first clock signal.

18. The resonator device according to claim 16,
wherein the circuit device includes:
   a first signal line through which the first clock signal is supplied to the time-digital conversion circuit; and
   a second signal line through which the second clock signal is supplied to the time-digital conversion circuit, and
a first shield line is physically disposed between the first signal line and the second signal line.

19. The resonator device according to claim 18,
wherein the circuit device includes the first shield line and a second shield line,
the first signal line is disposed between the second shield line and the first shield line, and
the second signal line is disposed between a third shield line and the first shield line.

* * * * *